US012684994B2

(12) United States Patent
Hirase et al.

(10) Patent No.: US 12,684,994 B2
(45) Date of Patent: Jul. 14, 2026

(54) DISPLAY DEVICE AND METHOD OF MANUFACTURING DISPLAY DEVICE

(71) Applicant: SHARP KABUSHIKI KAISHA, Sakai City (JP)

(72) Inventors: Takeshi Hirase, Sakai City (JP); Kaoru Abe, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 633 days.

(21) Appl. No.: 17/911,613

(22) PCT Filed: Mar. 25, 2020

(86) PCT No.: PCT/JP2020/013455
§ 371 (c)(1),
(2) Date: Sep. 14, 2022

(87) PCT Pub. No.: WO2021/192118
PCT Pub. Date: Sep. 30, 2021

(65) Prior Publication Data
US 2023/0123636 A1      Apr. 20, 2023

(51) Int. Cl.
*H10K 59/80*      (2023.01)
*H10K 59/12*      (2023.01)
*H10K 59/124*      (2023.01)

(52) U.S. Cl.
CPC ......... *H10K 59/873* (2023.02); *H10K 59/124* (2023.02); *H10K 59/1201* (2023.02); *H10K 59/879* (2023.02)

(58) Field of Classification Search
CPC .... H10K 50/858; H10K 59/124; H10K 71/00; H10K 59/1201; H10K 59/879;
(Continued)

(56) References Cited

U.S. PATENT DOCUMENTS 6,013,538 A * 1/2000 Burrows ................ H10K 50/11
438/22
2004/0229393 A1* 11/2004 Lai ..................... H10D 30/6713
257/E21.414

(Continued)

FOREIGN PATENT DOCUMENTS

WO      2019/030858 A1    2/2019

OTHER PUBLICATIONS

RefractiveIndex.Info (https://refractiveindex.info/?shelf=other&book=In2O3-SnO2&page=Konig#google_vignette (Year: 2025).*
(Continued)

*Primary Examiner* — Chad M Dicke
*Assistant Examiner* — Gary Abel
(74) *Attorney, Agent, or Firm* — ScienBiziP, P.C.

(57)      ABSTRACT
A display device includes a base member, a thin film transistor, an organic insulation film, a light-emitting layer, and a sealing layer. The display device has an active area and a non-active area. The non-active area includes a notched portion and a protrusion portion surrounding the notched portion and having, on a notched portion side, a side face including a reverse-tapered face. The light-emitting layer is disconnected as a result of a step at the protrusion portion. A filling material is embedded in at least a part of a space located between the reverse-tapered face and a top face of the organic insulation film. The top face overlaps the reverse-tapered face in a plan view.

15 Claims, 16 Drawing Sheets

(58) Field of Classification Search

CPC .... H10K 50/11; H10K 59/121; H10K 59/122; H10K 50/844; H10K 59/00; H10K 71/40; H10K 71/421; H10K 71/441; H10K 59/10–88; H10K 59/87; H10K 59/8722; H10K 59/873–874; G09F 9/00; G09F 9/30; H05B 33/04; H05B 33/22; H01L 22/12; H01L 22/10; H04B 10/00; H01J 61/025; H01Q 15/02

See application file for complete search history.

(56) References Cited

U.S. PATENT DOCUMENTS

| | | | | |
|---|---|---|---|---|
| 2006/0220544 | A1* | 10/2006 | Okuyama | H10K 59/805 |
| | | | | 313/506 |
| 2017/0031323 | A1* | 2/2017 | Kim | H10K 59/122 |
| 2017/0148856 | A1* | 5/2017 | Choi | H10K 59/873 |
| 2017/0229519 | A1* | 8/2017 | Suzuki | G02B 5/201 |
| 2018/0277609 | A1* | 9/2018 | Fukiwara | H10K 59/8731 |
| 2018/0358577 | A1* | 12/2018 | Inoue | H10K 50/828 |
| 2019/0326553 | A1 | 10/2019 | Abe | |
| 2020/0174295 | A1* | 6/2020 | Baek | G02F 1/133308 |
| 2020/0403171 | A1* | 12/2020 | Park | H10K 59/131 |
| 2021/0066410 | A1* | 3/2021 | Jo | H10K 59/40 |
| 2022/0181399 | A1* | 6/2022 | Shim | H10K 50/865 |
| 2023/0350255 | A1* | 11/2023 | Liu | H10K 59/124 |

OTHER PUBLICATIONS

Refractive Index database for ITO (Year: 2025).*
Refractive Index database for Optorez (Year: 2025).*
RefractiveIndex.Info (https://refractiveindex .info/?shelf=Other &book= In2O3-SnO2&page= Konig#google _ vignette - hereinafter Refractive Index. Info (Year: 2025).*

* cited by examiner

| | |
|---|---|
| FORM FIRST ELECTRODE | S4-1 |
| FORM ORGANIC INSULATION FILM AND DEPRESSION PORTION | S4-2 |
| FORM METAL LAYER | S4-3 |
| FORM PHOTORESIST LAYER | S4-4 |
| ETCH METAL LAYER | S4-5 |
| FORM EL COMMON LAYER AND EL LIGHT-EMITTING LAYER | S4-6 |
| FORM SECOND ELECTRODE | S4-7 |

| | |
|---|---|
| FORM FIRST INORGANIC SEALING FILM | S5-1 |
| FORM FILLING LAYER | S5-2 |
| ASH FILLING LAYER | S5-3 |
| FORM ORGANIC SEALING FILM | S5-4 |
| FORM SECOND INORGANIC SEALING FILM | S5-5 |

DISPLAY DEVICE AND METHOD OF MANUFACTURING DISPLAY DEVICE

TECHNICAL FIELD

The present disclosure relates to display devices including light-emitting elements and methods of manufacturing such a display device.

BACKGROUND

In general, if an external module is mounted to a display device including light-emitting elements, the external module is mounted to a non-active area outside the active area. In such cases, it is impossible to use the entire face of the device as a display screen, which degrades the designability of the display device. To provide a display device with improved designability by improving freedom in designing the display screen of the device, a feasible structure may be such that the external module is accommodated in the active area of the display device.

If an opening is formed in the active area of the display device to accommodate the external module in the active area of the display device, water and other foreign materials can infiltrate the interior through an end face of the opening. Therefore, these foreign materials may deactivate light-emitting elements, possibly causing an abnormal display.

For the purpose of preventing the infiltration of foreign materials in a known display device, a proposal has been made that a protrusion portion be formed along the periphery (i.e., inactive portion) of the active area where the opening is formed and that the light-emitting layer be disconnected as a result of a step at the protrusion portion (see Patent Literature 1 listed below). In addition, in this known display device, it is also shown that the side face on the opening side of the protrusion portion is a reverse-tapered face.

CITATION LIST

Patent Literature

Patent Literature 1: International Patent Application Publication, WO2019/030858 (Publication Date: Feb. 14, 2019)

SUMMARY

Technical Problem

In this known display device, since the side face on the opening side of the protrusion portion is a reverse-tapered face, a space (in other words, an air layer) can form below the side face, and light be scattered by this space. This scattering could lead to decreases in the display quality of the display device.

To address these problems, a display device in accordance with an aspect of the present disclosure includes: a base member; a thin film transistor formed on the base member; an organic insulation film formed on the thin film transistor; a light-emitting layer formed on the organic insulation film; and a sealing layer formed on the light-emitting layer, the display device having: an active area that contributes to display; and a non-active area surrounded by the active area, the non-active area including: a notched portion; and a protrusion portion surrounding the notched portion and having, on a notched portion side, a side face including a reverse-tapered face, the light-emitting layer being disconnected as a result of a step at the protrusion portion, a filling material being embedded in at least a part of a space located between the reverse-tapered face and a top face of the organic insulation film, the top face overlapping the reverse-tapered face in a plan view.

To address the problems, a method of manufacturing a display device in accordance with an aspect of the present disclosure is a method of manufacturing a display device including: a base member; a thin film transistor formed on the base member; an organic insulation film formed on the thin film transistor; a light-emitting layer formed on the organic insulation film; and a sealing layer formed on the light-emitting layer, the method including: the protrusion portion forming step of forming a protrusion portion in a lower layer of the light-emitting layer in a non-active area surrounded by an active area that contributes to display; the light-emitting layer forming step of forming the light-emitting layer on the organic insulation film and on the protrusion portion and disconnecting the light-emitting layer as a result of a step at the protrusion portion; and the notched portion forming step of forming a notched portion in a location surrounded by the protrusion portion, wherein in the protrusion portion forming step, the protrusion portion is formed so as to have, on a notched portion side of the protrusion portion, a side face including a reverse-tapered face, and the method further includes the embedding step of embedding a filling material in at least a part of a space located between the reverse-tapered face and a top face of the organic insulation film, the top face overlapping the reverse-tapered face in a plan view.

Advantageous Effects of Disclosure

According to a display device and a method of manufacturing a display device in accordance with an aspect of the present disclosure, decreases in display quality can be prevented even when the external module is accommodated in the non-active area surrounding the active area.

DESCRIPTION OF EMBODIMENTS

Embodiment 1

Figure 1:
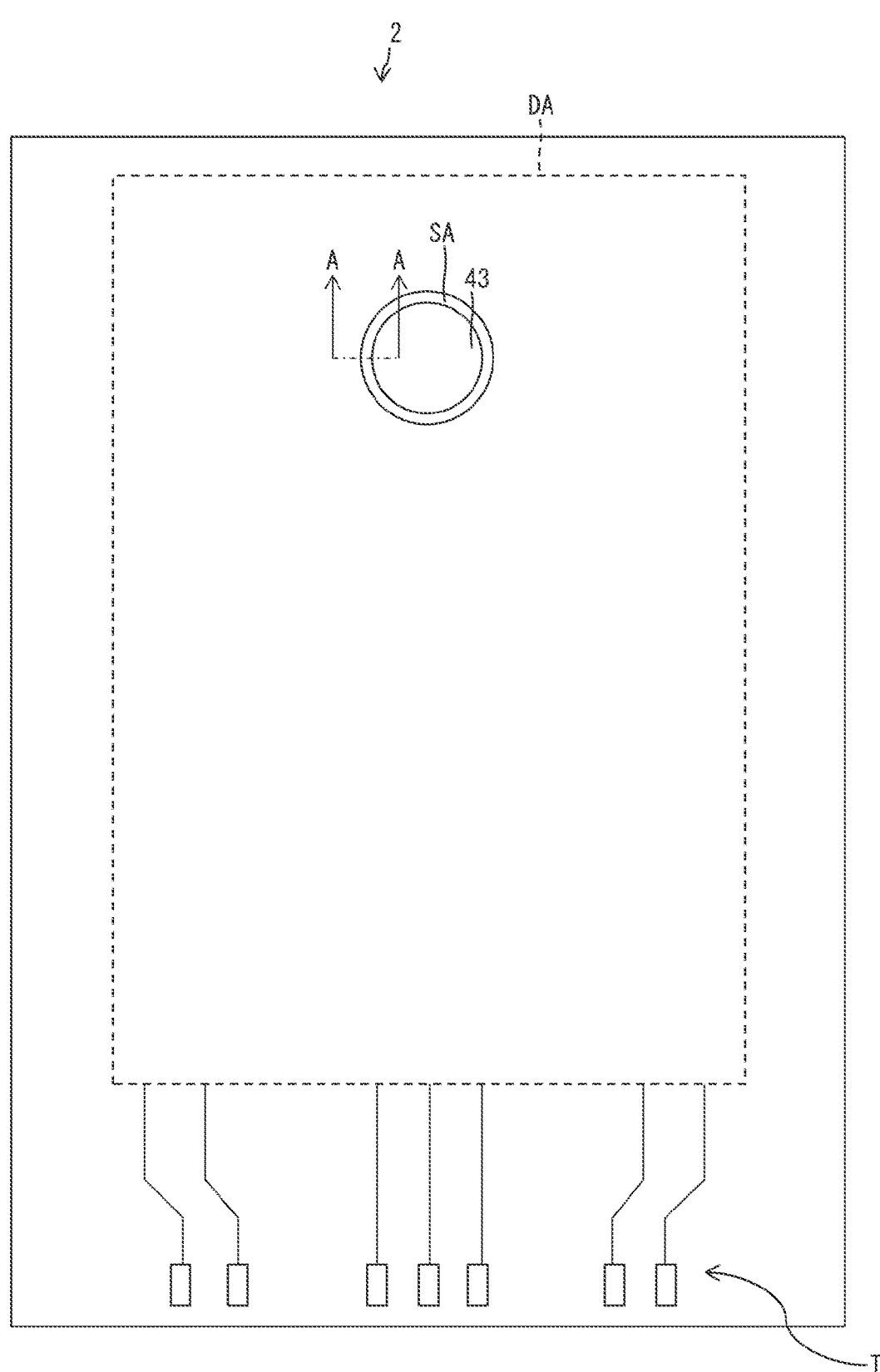
FIG. 1 is a top view of a display device in accordance with Embodiment 1 of the present disclosure.
Figure 2:
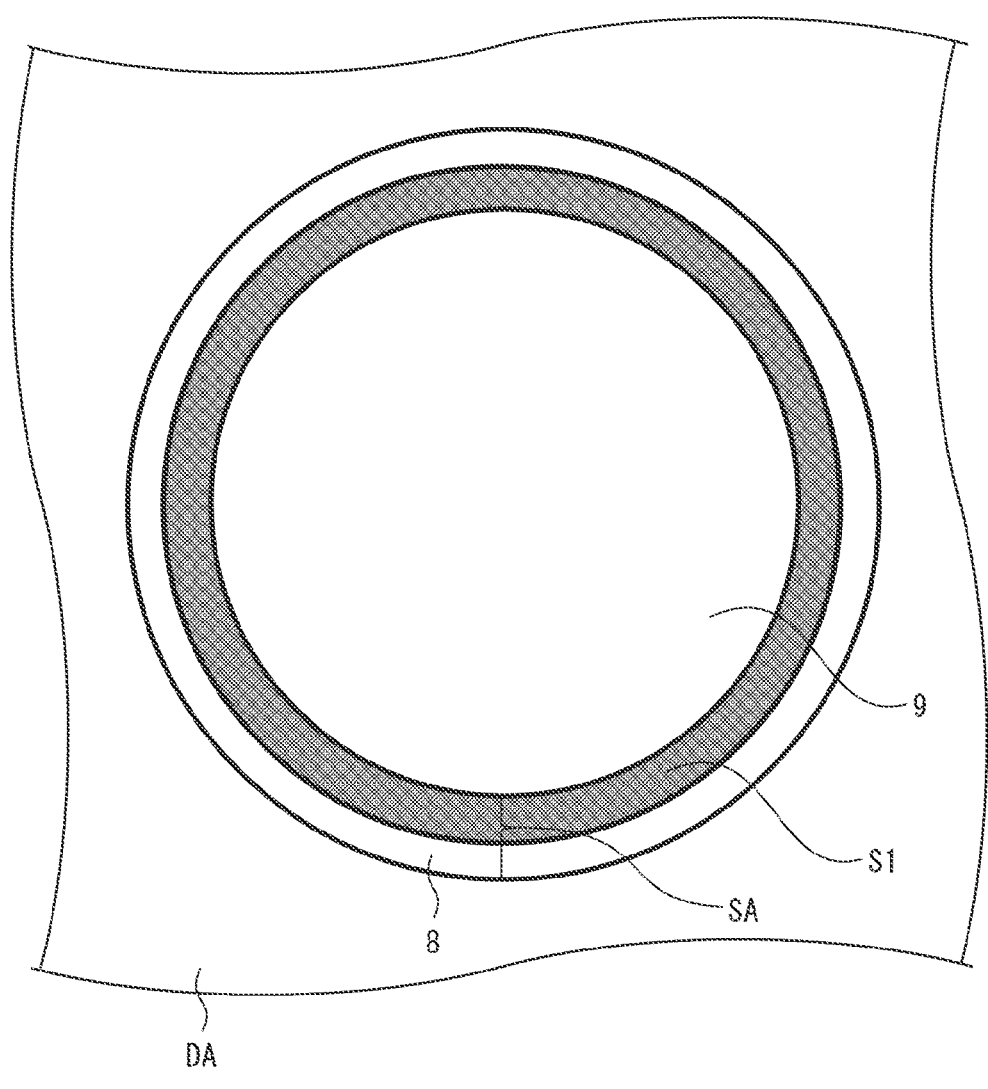
FIG. 2 is a top view of the surroundings of a notched portion of the display device in accordance with Embodiment 1 of the present disclosure.
Figure 3:
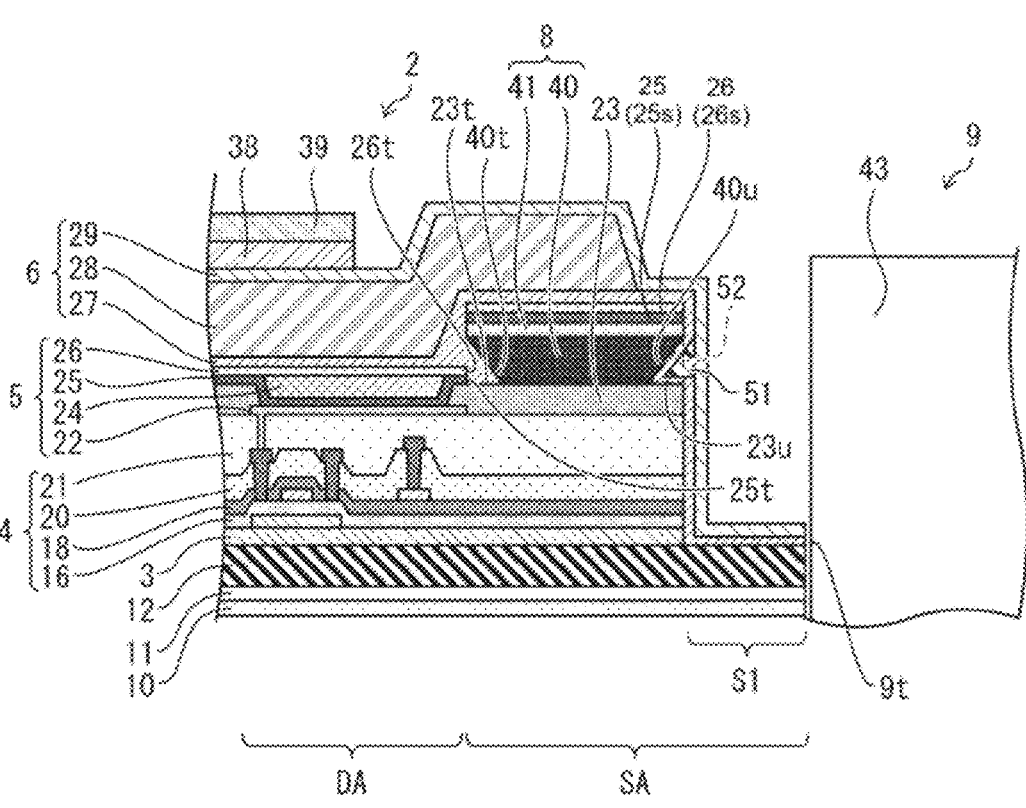
FIG. 3 is a cross-sectional view of the surroundings of a boundary between an active area and an external module of the display device in accordance with Embodiment 1 of the present disclosure.
Figure 4:
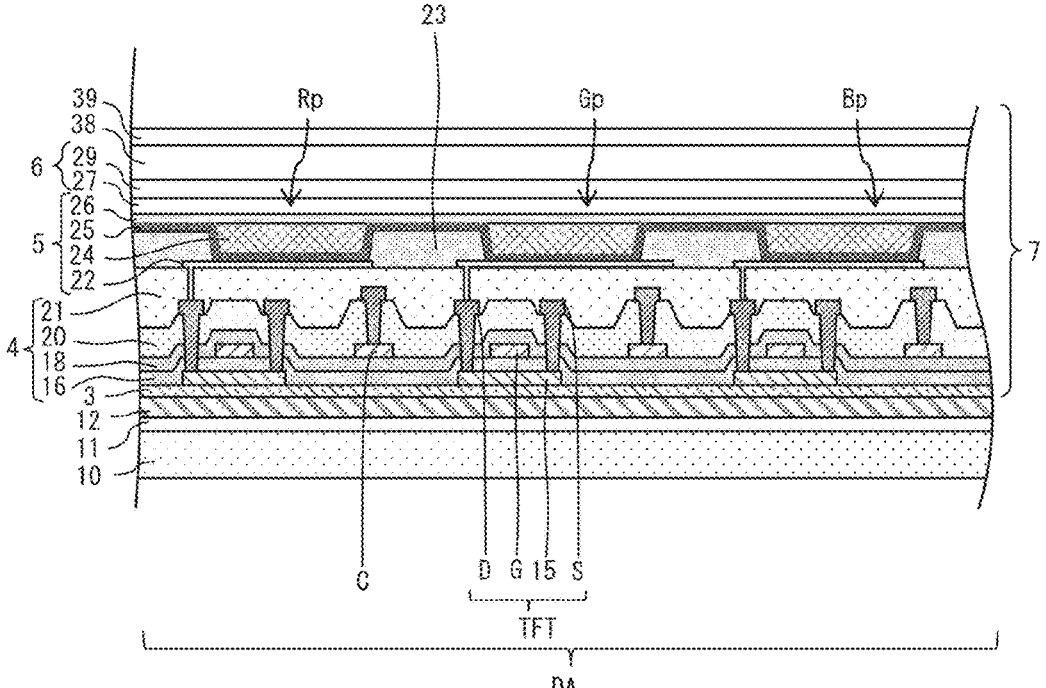
FIG. 4 is a cross-sectional view of the surroundings of a pixel region of the display device in accordance with Embodiment 1 of the present disclosure.
Figure 5:
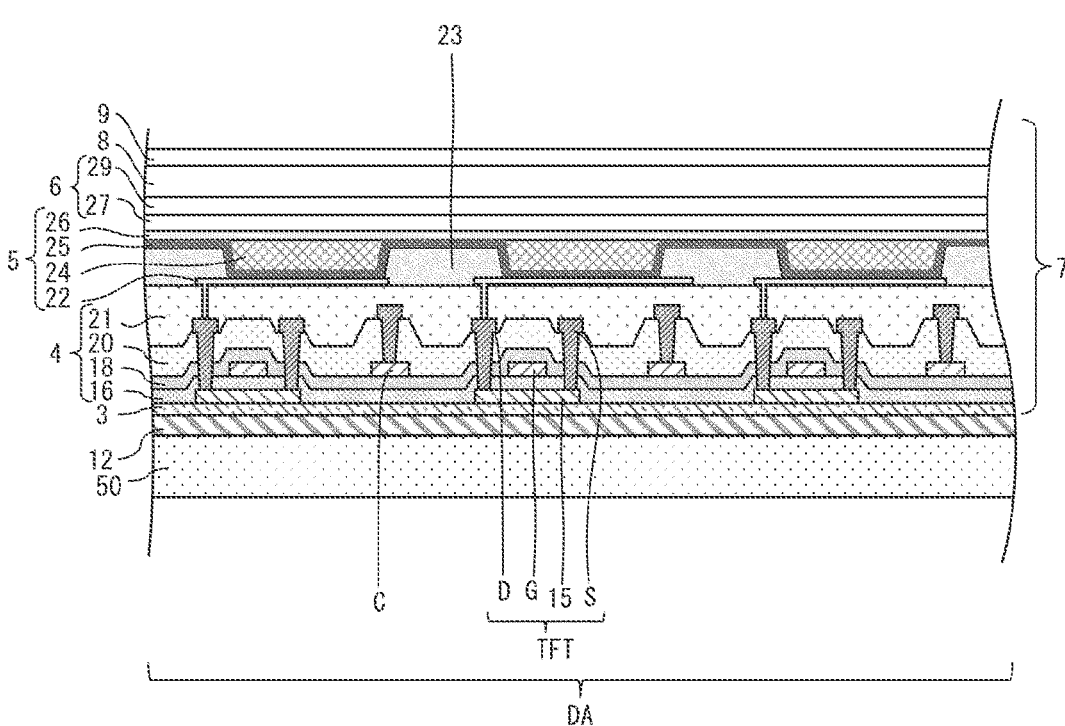
FIG. 5 is a cross-sectional view of the surroundings of the pixel region of the display device in accordance with Embodiment 1 of the present disclosure during manufacture.

FIG. 1 is a top view of a display device 2 in accordance with Embodiment 1. FIG. 2 is a schematic top view of the surroundings of a notched portion 9 of the display device 2. FIG. 3 is a cross-sectional view, taken along line A-A in FIG. 1, of the surroundings of an outer periphery of an external module 43 of the display device 2. FIG. 4 is an exemplary cross-sectional view of the surroundings of a pixel region including a light-emitting layer 5 of the display device 2. FIG. 5 is an exemplary cross-sectional view of the surroundings of the pixel region including the light-emitting layer 5 of the display device 2 during manufacture.

Figure 6:
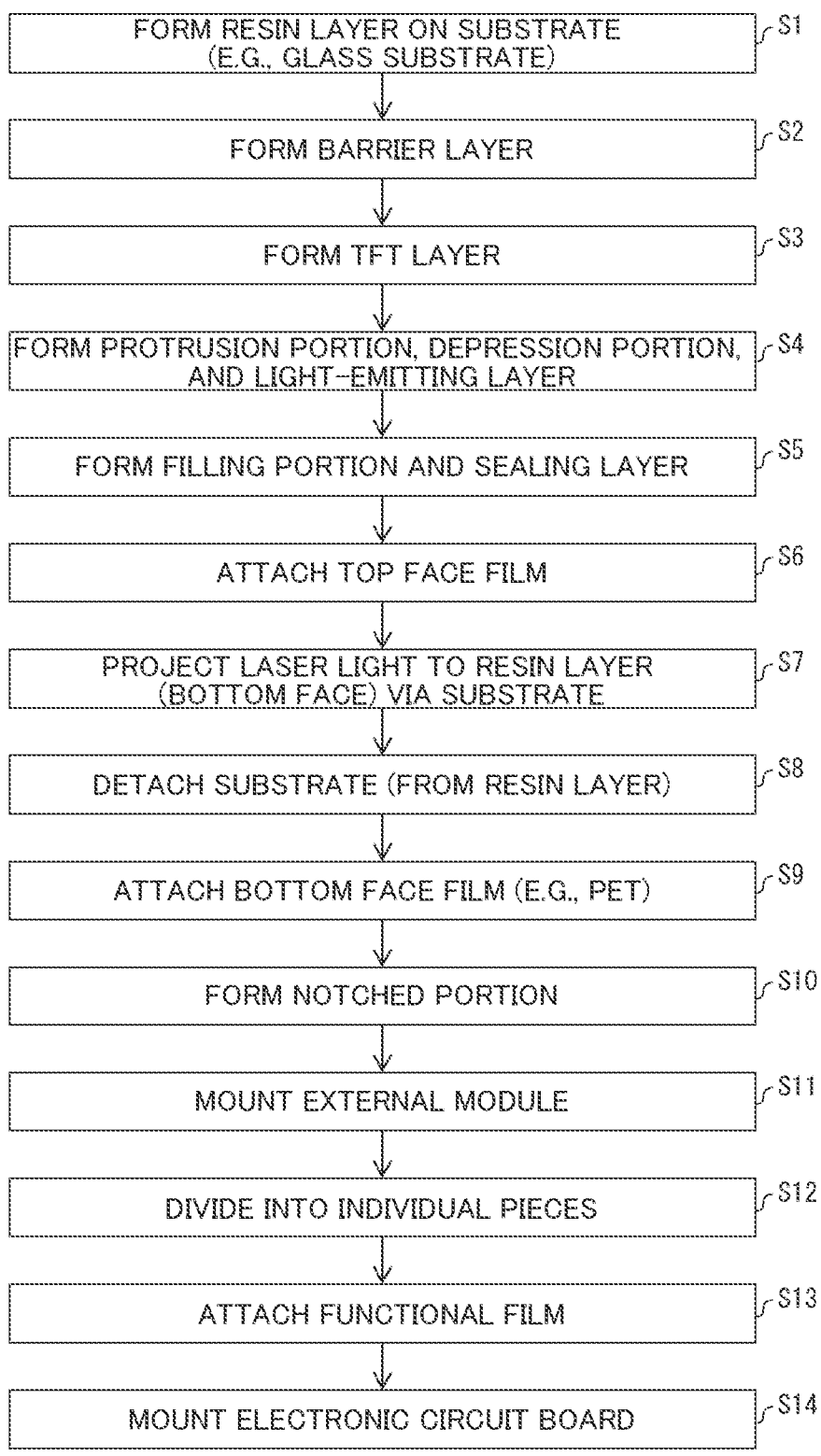
FIG. 6 is a flow chart representing a process of manufacturing the display device in accordance with Embodiment 1 of the present disclosure.

A method of manufacturing a display device in accordance with the present embodiment is described in accordance with the flow chart in FIG. 6 and with reference to FIGS. 1 to 5.

Referring to FIG. 4, first, a resin layer 12 is formed on a base member 10 (step S1). Next, a barrier layer 3 is formed (step S2). Next, a thin film transistor layer 4 is formed that includes a gate insulation film 16, passivation films 18, 20, and an organic interlayer film 21 (step S3). Next, a protrusion portion 8 shown in FIG. 3, a depression portion 45 (see FIG. 11) that is a precursor to a slit S1, and the light-emitting layer (e.g., OLED layer) 5 are formed (step S4). Next, a filling portion 51 and a sealing layer 6 including a first inorganic sealing film 27, an organic sealing film 28, and a second inorganic sealing film 29 are formed as a stack body 7 (step S5). Next, the notched portion 9 is formed, and the depression portion 45 is fabricated to form the slit S1 (step S10). Next, the external module 43 is mounted to the notched portion 9 (step S11). Next, the stack body 7, as well as the base member 10, is separated into individual pieces (step S12). Next, a functional film 39 is attached via an adhesion layer 38 (step S13). Next, an electronic circuit board is mounted to an end portion of the thin film transistor layer 4 (step S14). Hence, the display device 2 shown in FIG. 4 is obtained.

Note that to manufacture a flexible display device, as shown in FIG. 5, for example, first of all, the stack body 7 (the resin layer 12, the barrier layer 3, the thin film transistor layer 4, the light-emitting layer 5, and the sealing layer 6) is formed on a glass substrate 50. Next, a top face film is attached (step S6), and the bottom face of the resin layer 12 is irradiated with laser light through the glass substrate 50 (step S7). Here, the bottom face of the resin layer 12 (the interface with the glass substrate 50) is modified by abrasion, to reduce the binding of the resin layer 12 and the glass substrate 50. Next, the glass substrate 50 is detached from the resin layer 12 (step S8). Next, the base member 10 (the bottom face film of, for example, PET) is attached to the bottom face of the resin layer 12 via an adhesion layer 11 (step S9). Thereafter, the process proceeds to step S10 described earlier.

The resin layer 12 may be made of, for example, polyimide, epoxy, or polyamide. The bottom face film may be made of, for example, polyethylene terephthalate (PET).

The barrier layer 3 prevents foreign materials such as water and impurities from reaching the thin film transistor layer 4 and the light-emitting layer 5 while the display device is in use. The barrier layer 3 may include, fix example, a silicon oxide film, a silicon nitride film, a silicon oxynitride film, or a stack of these films. These films can be formed by CVD.

The thin film transistor layer 4 includes a semiconductor film 15, the gate insulation film 16, a gate electrode G, the passivation films 18, 20, a capacitor electrode C, a terminal TM, a source line S, a drain line D, and the organic interlayer film (planarization film) 21. The gate insulation film 16 is formed in an upper layer of the semiconductor film 15. The gate electrode G is formed in an upper layer of the gate insulation film 16. The passivation films 18, 20 are formed in an upper layer of the gate electrode G. The capacitor electrode C and the terminal TM are formed in an upper layer of the passivation film 18. The source line S and the drain line D are formed in an upper layer of the passivation film 20. The organic interlayer film 21 is formed in an upper layer of the source line S and the drain line D. A thin layer transistor (TFT) is formed including the semiconductor film 15, the gate insulation film 16, and the gate electrode G.

The semiconductor film 15 may be made of, for example, a low-temperature polysilicon (LIPS) or an oxide semiconductor. The gate insulation film 16 is made of, for example, a CVD formed film of silicon oxide (SiOx) or silicon nitride (SiNx) or a stack of these films. The gate electrode G a source electrode S, a drain electrode D, and terminals are made of, for example, a monolayer or multilayer film of a metal. This metal includes, for example, at least one of aluminum (Al), tungsten (W), molybdenum (Mo), tantalum (Ta), chromium (Cr), titanium (Ti), and copper (Cu). Note that FIG. 2 shows the thin film transistor with the semiconductor film 15 as a channel as having a top-gate structure. Alternatively, the thin film transistor may have a bottom-gate structure.

The gate insulation film 16 and the passivation films 18, 20 may include, for example, a CVD-formed film of silicon oxide (SiOx) or silicon nitride (SiNx) or a stack of these films. The organic interlayer film 21 may be made of, for example, a photosensitive organic material, such as polyimide or acrylic, that can be provided by printing or coating technology.

The light-emitting layer 5 (e.g., organic light-emitting diode layer) includes a first electrode 22 (e.g., anode electrode), an organic insulation film 23, an EL (electroluminescence) light-emitting layer 24, an EL common layer 25, and a second electrode 26. The first electrode 22 is formed in an upper layer of the organic interlayer film 21.

The organic insulation film 23 covers an edge of the first electrode 22. The EL light-emitting layer 24 and the EL common layer 25 are formed in an upper layer of the first electrode 22. The second electrode 26 is formed in an upper layer of the EL light-emitting layer 24 and the EL common layer 25. The light-emitting element (e.g., organic light-emitting diode) includes the first electrode 22, the EL light-emitting layer 24, the EL common layer 25, and the second electrode 26. The organic insulation film 23 in an active area DA functions as a bank (pixel partition wall) for defining subpixels.

The organic insulation film 23 may be made of, for example, a photosensitive organic material, such as polyimide or acrylic, that can be provided by printing or coating technology. The organic insulation film 23 may be applied to, for example, the active area DA and a non-active area outside the active area DA by slit-coating.

The EL light-emitting layer 24 is formed in a region (subpixel region) surrounded by the organic insulation film 23 by vapor deposition. The EL common layer 25 is made, for example, on the first electrode 22 and the organic insulation film 23 by vapor deposition. When the light-emitting layer 5 is an organic light-emitting diode (OLED) layer, the EL light-emitting layer 24 and the EL common layer 25 are formed by, for example, stacking a hole injection layer, a hole transport layer, a light-emitting layer, an electron transport layer, and an electron injection layer, all of which are provided in this order when viewed from below. Note that similarly to the EL common layer 25, one or more EL light-emitting layers 24 may be rendered a common layer (shared by a plurality of pixels).

The first electrode (anode) 22 includes, for example, a stack of ITO (indium tin oxide) and a Ag-containing alloy and is light-reflective. The second electrode (e.g., cathode electrode) 26 is a common electrode and may be made of a transparent metal such as ITO (indium tin oxide) or IZO (indium zinc oxide).

When the light-emitting layer 5 is an MED layer, holes and electrons recombine in the EL light-emitting layer 24 due to a drive current between the first electrode 22 and the second electrode 26, to produce excitors that transition to the ground state to emit light. The light-emitting layer 5 is not necessarily a part of the OLED element, but may be a part of an inorganic light-emitting diode or a quantum-dot light-emitting diode.

The sealing layer 6 covers the light-emitting layer 5 to prevent foreign materials such as water and oxygen from reaching the light-emitting layer 5. The sealing layer 6 includes: the first inorganic sealing film 27 covering the organic insulation film 23 and the second electrode 26; the organic sealing film 28 provided in an upper layer of the first inorganic sealing film 27 and covering the first inorganic sealing film 27; and the second inorganic sealing film 29 provided in an upper layer of the organic sealing film 28 and covering the organic sealing film 28. The first inorganic sealing film 27 and the second inorganic sealing film 29 may each be provided in an upper layer of the filling portion 51 or in a lower layer of the filling portion 51. The organic sealing film 28 functions as a buffer layer for the second inorganic sealing film 29. Note that the second inorganic sealing film 29 may be formed covering the first inorganic sealing film 27 with no organic sealing film 28.

The functional film 39 has, for example, an optical compensation function, a touch sensor function, and a protection function. When there is provided a layer that has one or more of these functions in an upper layer of the light-emitting layer 5, the functional film 39 may be thinned down or omitted. The electronic circuit board is, for example, an IC chip or flexible printed board (FPC) mounted on the terminal TM shown in FIG. 2.

Referring to FIG. 3, the display device 2 has the notched portion 9 continuously extending from the display screen to the base member 10 and accommodates the external module 43 in the notched portion 9. Referring to FIGS. 1 and 2, the external module 43 is accommodated inside the notched portion 9 provided in a location surrounded by an end portion of the active area DA that contributes to the display produced by the display device 2. In other words, the active area DA is present all around the notched portion 9.

Referring to FIG. 3, a frame area SA (non-active area) is formed between the active area DA and the notched portion 9. Referring to FIGS. 1 and 2, the frame area SA is formed in a location surrounding all the outer circumference of the external module 43 accommodated in the notched portion 9. Referring to FIG. 2, in the frame area SA, the protrusion portion 8 and the slit S1 are provided in this order toward the notched portion 9. In other words, in the frame area SA, the slit S1 is formed surrounding the notched portion 9, and the protrusion portion 8 is formed surrounding the slit S1. In an upper layer of the organic insulation film 23 in the frame area SA, as shown in FIG. 3, the protrusion portion 8, the EL common layer 25, and the second electrode 26 are provided in this order.

The protrusion portion S includes: a metal layer 40 containing a metal material; and a photoresist layer 41 provided in an upper layer of the metal layer 40 and containing a photosensitive resin. Of the side faces of the metal layer 40, the side face in proximity to the active area DA includes a reverse-tapered face 40t tilted to a side facing the notched portion 9 from the display screen toward the base member 10. In a plan view, an end face 25t of the EL common layer 25 is formed on a top face 23t of the organic insulation film 23 overlapping the reverse-tapered face 40t. In addition, of the side faces of the metal layer 40, the side face in proximity to the notched portion 9 includes a reverse-tapered face 40u tilted to a side facing the active area DA from the display screen toward the base member 10. The filling portion 51 is provided between the reverse-tapered face 40u and a top face 23u of the organic insulation film 23 overlapping the reverse-tapered face 40u in a plan view.

The slit S1 formed by forming the notched portion 9 in such a manner that an edge of the notched portion 9 passes through the depression portion 45. The depression portion 45 is a groove formed by removing from the barrier layer 3 to the organic insulation film 23 along the periphery on the notched portion 9 side of the frame area SA.

The EL common layer 25 and the second electrode 26 in the active area DA are provided in an upper layer of any of the first electrode 22, the organic insulation film 23, and the EL light-emitting layer 24. In contrast, an EL layer 25s and the second electrode 26s in the frame area SA are formed in an upper layer of the protrusion portion 8. Additionally, the EL common layer 25 and the second electrode 26 each do not continuously extend between the active area DA and the frame area SA. In other words, the light-emitting layer 5 is disconnected as a result of a step between the active area DA and the frame area SA. Due to this disconnection of the light-emitting layer 5 as a result of a step, the EL common layer 25 includes the end face 25t, and the second electrode 26 includes an end face 26t. The end faces 25t, 26t are covered by the first inorganic sealing film 27.

Referring to FIG. 3, the display device 2 in accordance with the present embodiment has the active area DA that contributes to display and the non-active area surrounded by the active area DA. In the non-active area, the notched portion 9 and the protrusion portion 8, surrounding the notched portion 9 and having a side face on the notched portion 9 side including the reverse-tapered face 40u, are provided. The EL light-emitting layer 24 is disconnected as a result of a step at the protrusion portion 8. Therefore, a display device in which foreign materials are restrained from infiltrating the EL light-emitting layer 24 in the active area DA can be provided by a manufacturing method by which damage to the EL light-emitting layer 24 is reduced, while maintaining freedom in designing the display screen.

Furthermore, the display device 2 in accordance with the present embodiment includes the filling portion 51 embedded in at least a part of a space 52 located between the reverse-tapered face 40u included in the notched portion 9 side of the protrusion portion 8 and the top face 23u of the organic insulation film 23 overlapping the reverse-tapered face 40u in a plan view. Therefore, light is less scattered by the space 52.

The present embodiment relates to the above-described structure of the display device 2 and in particularly to the filling portion 51.

Structure of Filling Portion

Figure 7:
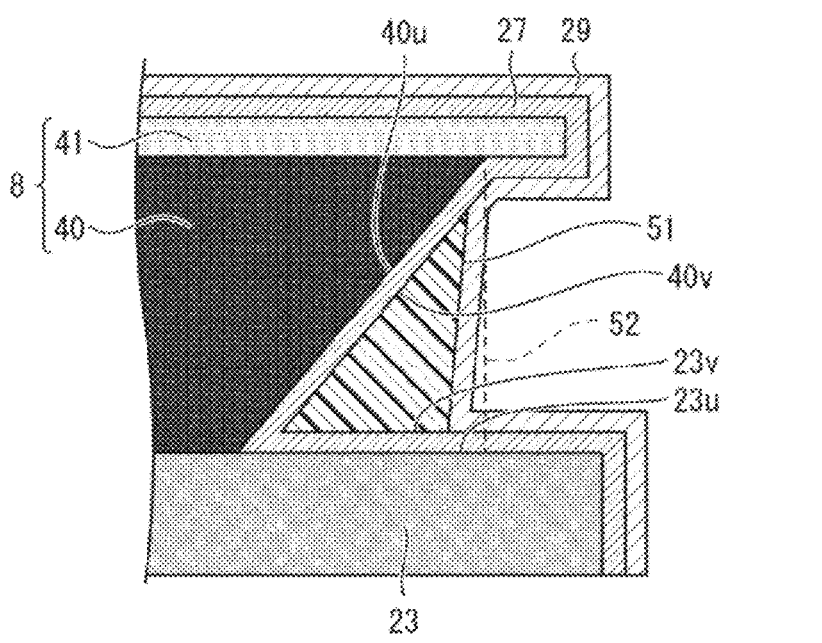
FIG. 7 is a cross-sectional view of a filling portion and the vicinity thereof in accordance with Embodiment 1 of the present disclosure when the fill ratio is less than 100%.
Figure 8:
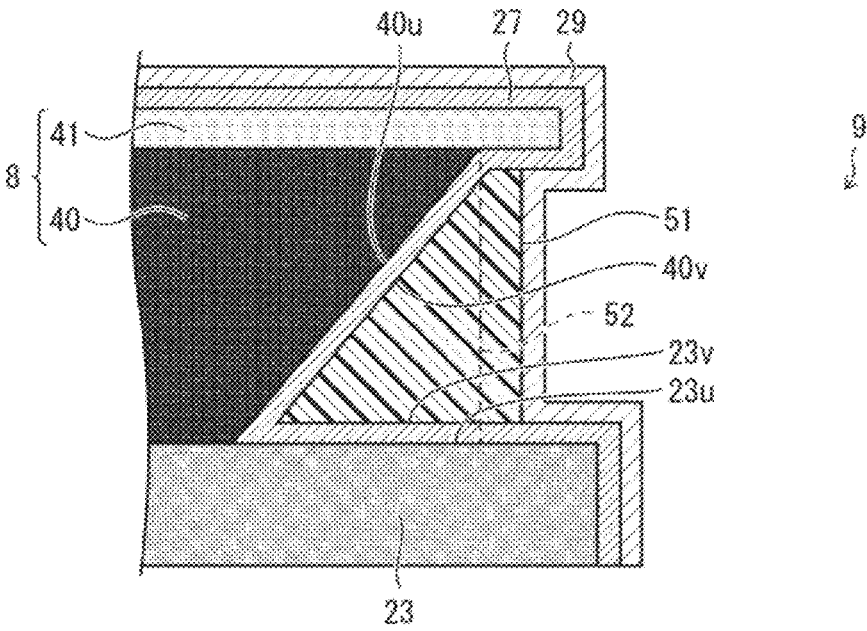
FIG. 8 is a cross-sectional view of a filling portion 51 and the vicinity thereof in accordance with Embodiment 1 of the present disclosure when the fill ratio exceeds 100%.
Figure 9:
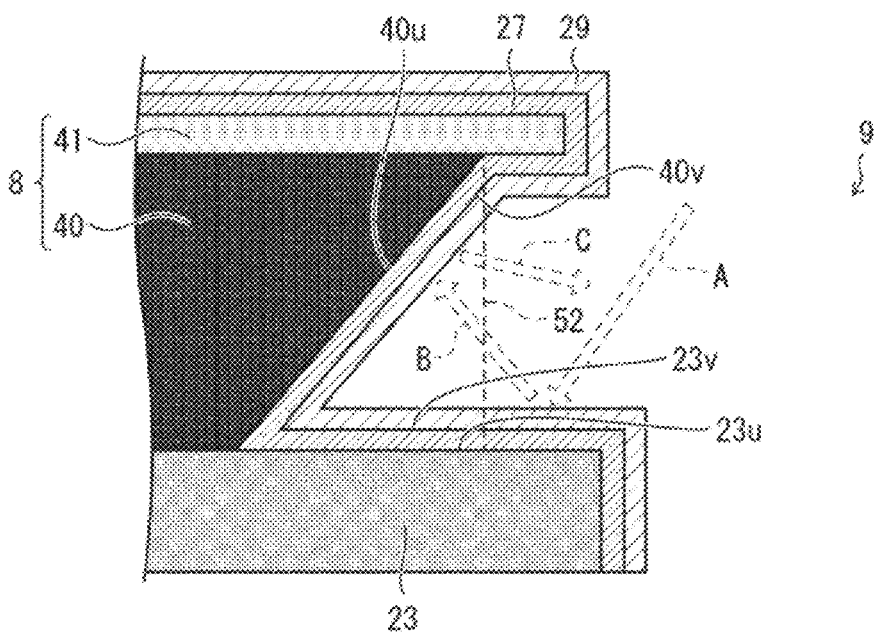
FIG. 9 is a cross-sectional view of a comparative example in which no filling portion 51 is provided.

The following will describe a structure of the filling portion 51 with reference to FIGS. 7 to 9.

FIG. 7 is a cross-sectional view of the filling portion 51 and the vicinity thereof when the fill ratio is less than 100%. FIG. 8 is a cross-sectional view of the filling portion 51 and the vicinity thereof when the fill ratio exceeds 100%. FIG. 9 is a cross-sectional view of a comparative example in Which no filling portion 51 is provided.

Referring to FIGS. 7 and 8, the filling portion 51 is a filling material embedded in the space 52. The space 52 is located between the reverse-tapered face 40u of the protrusion portion 8 and the top face 23u of the organic insulation film 23 overlapping the reverse-tapered face 40u in a plan view. In other words, the space 52 overlaps the reverse-tapered face 40u in a plan view perpendicular to the base member 10 (or the glass substrate 50) and is hidden behind the protrusion portion 8.

The organic insulation film 23 is typically made of a resin such as polyimide, and polyimide has a refractive index of approximately 156. The first inorganic sealing film 27 and the second inorganic sealing film 29 are typically made of an inorganic film such as silicon nitride, and silicon nitride has a refractive index of approximately 185. In contact, air has a refractive index of approximately 1. Therefore, the organic insulation film 23, the first inorganic sealing film 27, and the second inorganic sealing film 29 generally have a refractive index extremely larger than the refractive index of air. Therefore, the light incident to the organic insulation film 23, the first inorganic sealing film 27, and the second inorganic sealing film 29 from air is likely to be reflected. In addition, the metal layer 40 has a reflective surface. Furthermore, these reflections are generally not specular reflection, but scatter reflection.

The comparative example shown in FIG. 9 includes no filling portion 51. Therefore, the space 52 is filled with air. Accordingly, the external light entering the space 52 from above the display device 2 as indicated by arrow A in FIG. 9 is likely to be reflected as indicated by arrow B and arrow C. As a result, the external light is likely to be scattered by the space 52 and return to the notched portion 9. This can cause a problem of decreases in display quality due to scattered light. Furthermore, the scattered light can be received, inducing unwanted noise, particularly when the external module 43 is a light-receiving module such as a camera. On the other hand, when the external module 43 is a light-emitting module, the space 52 can undesirably scatter light in unintended directions.

In view of this, as shown in FIGS. 7 and 8, the structure in accordance with the present embodiment includes the filling portion 51. The light incident from the filling portion 51 to the organic insulation film 23 and the first inorganic sealing film 27 is less likely to be reflected than the light incident from air. As a result, the scattering of light by the space 52 can be reduced. As a result, in the present embodiment, decreases in the display quality of the display device 2 can be prevented even if the external module is accommodated in the notched portion 9 surrounded by the active area DA. Additionally, the above-described problems that can occur in the external module 43 can also be prevented. Although the description above assumes that the notched portion 9 is surrounded entirely by the active area DA, the present disclosure is not limited to such examples and also applicable to, for example, a notch portion surrounded by the active area DA in at least a part of the circumference of a notched portion (e.g., a notched portion with three of the four sides thereof being surrounded by the active area DA).

The fill ratio of the space 52 by the filling portion 51 is measured by the ratio of the cross-sectional area of the filling portion 51 to the cross-sectional area of the space 52 in a cross-section that is perpendicular to both the reverse-tapered face 40u of the protrusion portion 8 and the top face 23u of the organic insulation film 23. The fill ratio is preferably 50% or greater, in other words, the volume of the space 52 is at least half filled by the filling portion 51, as shown in FIG. 7, to sufficiently reduce scattering of light by the space 52. In addition, the fill ratio may exceed 100%, in other words, the filling portion 51 may overflow from the space 52, as shown in FIG. 8. The filling portion 51 may significantly overflow from the space 52, for example, with a fill ratio reaching 150%. Additionally, the fill ratio may be precisely 100% (not shown).

Note that the filling portion 51 in the exemplary structures shown in FIGS. 3, 8, and 9 is provided in a layer that is an upper layer of the first inorganic sealing film 27 and that is also a lower layer of the second inorganic sealing film 29. Because of this, strictly, the filling portion 51 is embedded in a space between (i) a surface 40y that is a part of the first inorganic sealing film 27 formed along the reverse-tapered face 40u of the protrusion portion 8 and (ii) a surface 23v that is a part of the first inorganic sealing film 27 formed along the top face 23u of the organic insulation film 23. Therefore, strictly, the fill ratio is measured on this space. Meanwhile, the filling portion 51 may be provided in a lower layer of the first inorganic sealing film 27 or in an upper layer of the second inorganic sealing film 29. In addition, the first inorganic sealing film 27 and the second inorganic sealing film 29 are much thinner than the protrusion portion 8 is high. Therefore, detailed description is omitted about the volume occupied in the space 52 by the first inorganic sealing film 27 and the second inorganic sealing film 29 for simple description.

The refractive index of the filling material for the filling portion 51 is preferably from 1.5 to 2.0, both inclusive, because at least one of the elements that may be in contact with the filling portion 51 (specifically, the organic insulation film 23, a first inorganic insulation film 27, the second inorganic sealing film 29, and the photoresist layer 41) is typically made of a material with a refractive index of from 1.5 to 2.0, both inclusive. For instance, the refractive index of polyimide, typically constituting the organic insulation film 23, is approximately 1.56. Additionally, for example, the refractive index of silicon nitride, typically constituting the first inorganic sealing film 27 and the second inorganic sealing film 29, is approximately 1.85.

For instance, the refractive index of the filling material and the refractive index of the organic insulation film 23 preferably differ by less than 0.5. In such cases, light is barely reflected at the interface of the organic insulation film 23 and the filling portion 51. Therefore, scattering of light by the space 52 can be further reduced.

Additionally, for example, the refractive index of the filling material and the refractive index of the first inorganic sealing film 27 preferably differ by less than 0.5. In such cases, light is barely reflected at the interface of the first inorganic sealing film 27 and the filling portion 51. Therefore, scattering of light by the space 52 can be further reduced. In addition, for example, the refractive index of the filling material and the refractive index of the second inorganic sealing film 29 preferably differ by less than 0.5. In such cases, light is barely reflected at the interface of the second inorganic sealing film 29 and the filling portion 51. Therefore, scattering of light by the space 52 can be further reduced.

Alternatively or additionally, the optical concentration of the filling portion 51 is preferably 0.1 or greater (the amount of light returning from the filling portion 51 to the notched portion 9 is measured with respect to the amount of light incident from the notched portion 9 to the filling portion 51). Here, the optical concentration is measured using a spectrometer, a transmittance measuring instrument, or an optical concentration measuring instrument. In such cases, the light passing through the filling portion 51 is rapidly attenuated. Therefore, scattering of light by the space 52 can be further reduced.

In addition, the filling material is preferably a resin material. When the filling material is a resin material, the filling material (see a filling layer 53 in FIG. 17) can be easily provided inside and outside the space 52 and removed from the outside of the space 52 by ashing as will be described later in detail. Therefore, the filling material can be easily embedded in the space 52. This resin material preferably includes, for example, at least one of the groups including polyurea, siloxane polymer, and acrylic.

The filling portion 51 is preferably provided in an upper layer of the first inorganic sealing film 27. In such cases, the light-emitting layer 5 is protected by the first inorganic sealing film 27 in the step of forming the filling portion 51. Therefore, the step of forming the filling portion 51 can be prevented from damaging the light-emitting layer 5. In addition, since the first inorganic sealing film 27 covers the reverse-tapered face 40u of the protrusion portion 8, water and other foreign materials can be restrained from reaching the protrusion portion 8.

The filling portion 51 is preferably formed in a lower layer of the second inorganic sealing film 29. In such cases, since the second inorganic sealing film 29 covers the filling portion 51, water and other foreign materials can be restrained from reaching the filling portion 51.

Forming Protrusion Portion

A detailed description is given of the formation of the protrusion portion 8 and the light-emitting layer 5 that is a part of a method of manufacturing the display device 2 in accordance with the present embodiment, with reference to FIGS. 10 to 14.

Figure 10:
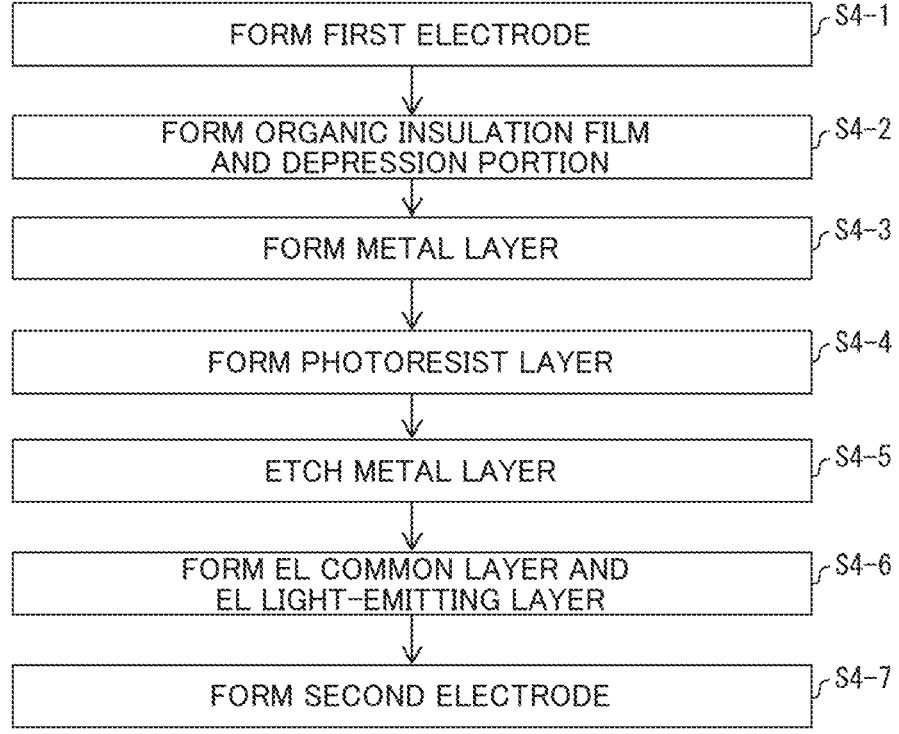
FIG. 10 is a flow chart representing a process of fabricating a protrusion portion and a light-emitting layer of the display device in accordance with Embodiment 1 of the present disclosure.

FIG. 10 is a flow chart for describing in more detail an exemplary formation of the protrusion portion 8 and the light-emitting layer 5 represented by step S4 in FIG. 6. The formation of the filling portion 51 and the sealing layer 6 is described in accordance with the flow chart in FIG. 10 and with reference to the step specific cross-sectional views shown in FIGS. 11 to 14.

Figure 11:
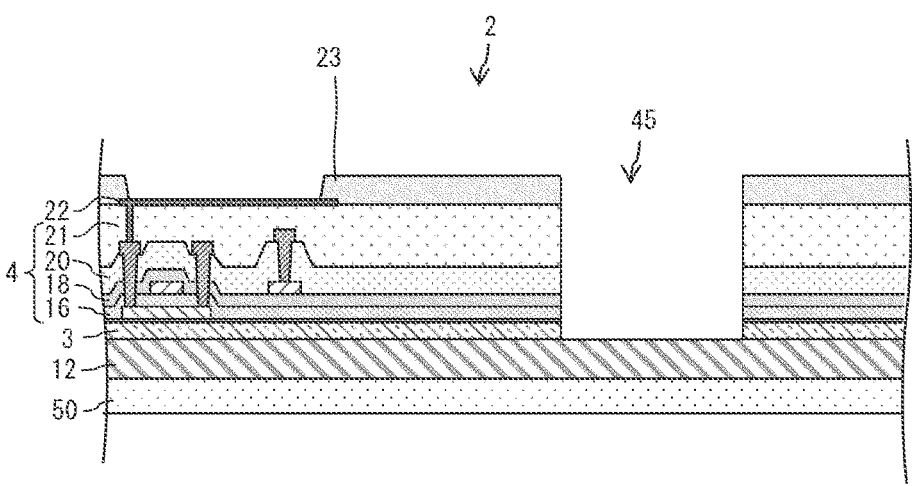
FIG. 11 is a step-specific, sequential cross-sectional view of the process of manufacturing the display device in accordance with Embodiment 1 of the present disclosure.

First, after the members from the glass substrate 50 to the thin film transistor layer 4 are formed (step S1 to step S3), as shown in FIG. 11, the first electrode 22 is formed (step S4-1), next, the organic insulation film 23 is applied, and the organic insulation film 23 is patterned (step S4-2) so as to provide an opening in a location overlapping the first electrode 22 in a plan view. Simultaneously with the patterning, the members from the barrier layer 3 to the organic insulation film 23 are removed from a part of the stack body where there is provided no first electrode 22, to form the depression portion 45.

Then, by performing step S4-3 to step S4-5 described below (protrusion portion forming steps), the protrusion portion 8 is formed in a lower layer of the EL light-emitting layer 24.

Figure 12:
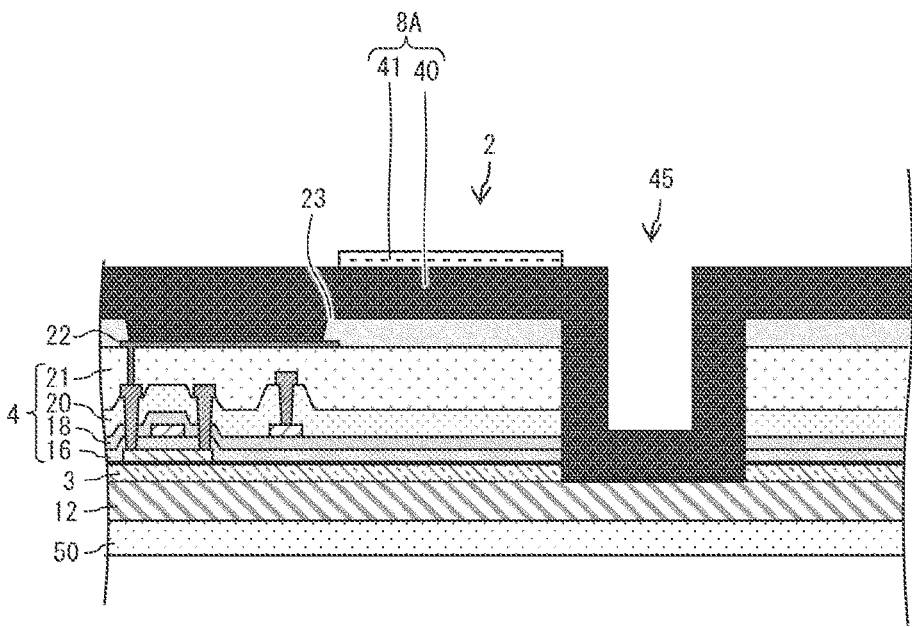
FIG. 12 is another step-specific, sequential cross-sectional view of the process of manufacturing the display device in accordance with Embodiment 1 of the present disclosure.
Figure 13:
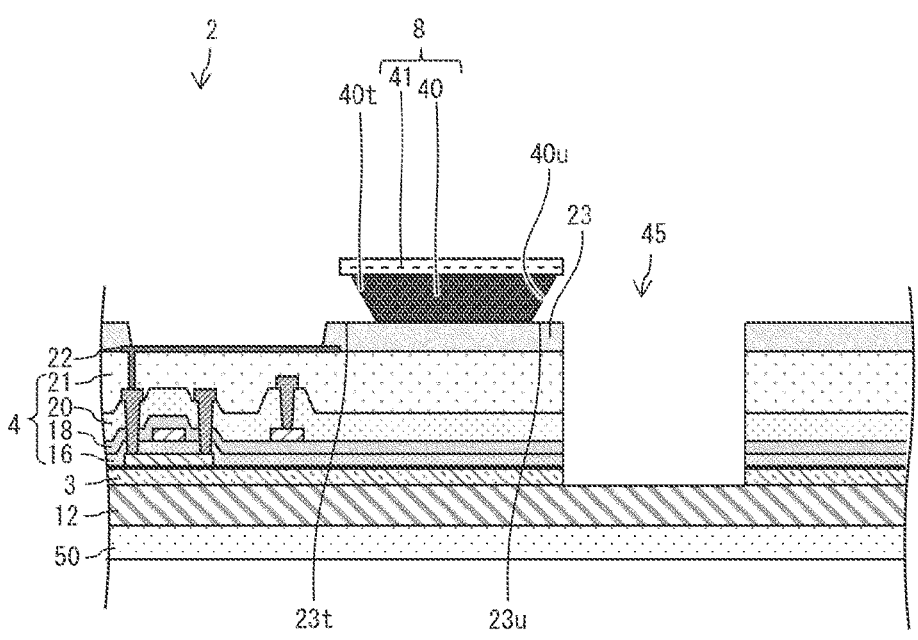
FIG. 13 is still another step-specific, sequential cross-sectional view of the process of manufacturing the display device in accordance with Embodiment 1 of the present disclosure.

Next, the metal layer 40 is formed on the organic insulation film 23 (step S4-3), the photoresist layer 41 is formed in an upper layer of the metal layer 40 (step S4-4), and the photoresist layer 41 is patterned by photolithography using a mask. Hence, a protrusion portion layer 8A shown in FIG. 12 is formed. In doing so, the photoresist layer 41 is not formed on the depression portion 45.

Next, the metal layer 40 is etched by isotropic etching through the photoresist layer 41 (step S4-5). In doing so, materials and etchants used for the first electrode 22 and the metal layer 40 are selected so that the first electrode 22 is not etched in the etching of the metal layer 40.

The metal layer 40 below the photoresist layer 41 is partially etched away by the overreaching flow of etchant along an end portion of the photoresist layer 41 due to the characteristics of isotropic etching. By such etching, the protrusion portion 8 is obtained with the reverse-tapered face 40t and the reverse-tapered face 40u shown in FIG. 3 on the sides thereof.

Next, the EL light-emitting layer 24 and the EL common layer 25 are formed (step S4-6, light-emitting layer forming step). In doing so, the EL common layer 25 is not formed reaching as far as the top face 23t and the top face 23u of the organic insulation film 23 that are behind the protrusion portion 8 in a plan view. Furthermore, since the top face of the organic insulation film 23 and the top face of the protrusion portion 8 differ in the height from the glass substrate 50, the EL common layer 25 is disconnected at the end portion of the protrusion portion 8 as a result of a step. Therefore, in a plan view, the end face 25t of the EL common layer 25 is present in a location overlapping the reverse-tapered face 40t.

Figure 14:
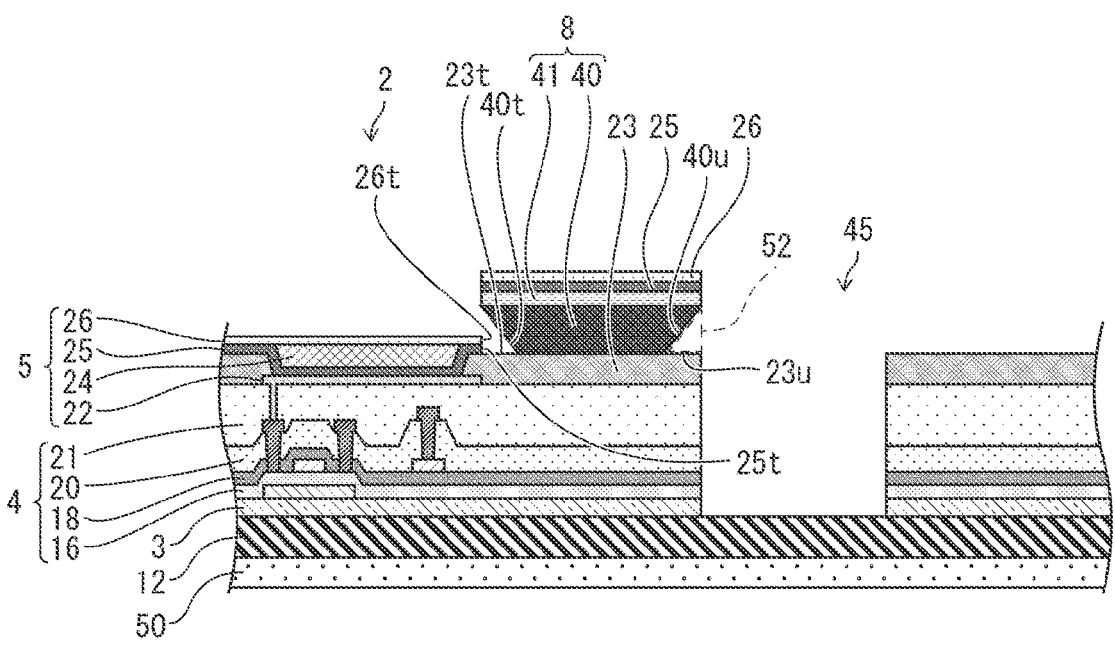
FIG. 14 is yet another step-specific, sequential cross-sectional view of the process of manufacturing the display device in accordance with Embodiment 1 of the present disclosure.

Next, the second electrode 26 is formed (step S4-7). In this step, similarly to the above, no second electrode 26 is formed on the top face 23t and the top face 23u of the organic insulation film 23. In addition, in a plan view, the end face 26t of the second electrode 26 is present in a location overlapping the reverse-tapered face 40t. The light-emitting laser 5 shown in FIG. 14 is formed by the above. In addition, the space 52 shown in FIG. 14 is open between the reverse-tapered face 40u on the notched portion 9 side of the metal layer 40 and the top face 23u of the organic insulation film 23 overlapping the reverse-tapered face 40u in a plan view.

Forming Filling Portion

A detailed description is given next of the formation of the filling portion 51 and the sealing layer 6 that is a part of the method of manufacturing the display device 2 in accordance with the present embodiment with reference to FIGS. 15 to 19.

Figure 15:
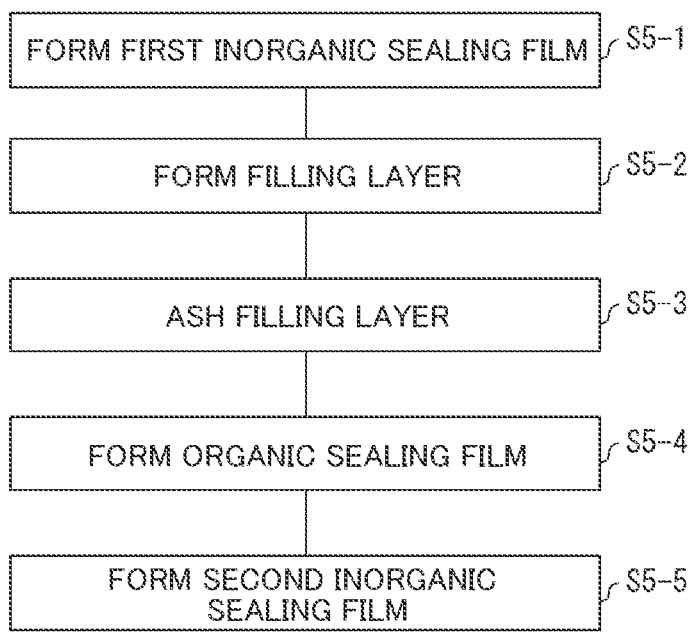
FIG. 15 is a flow chart representing a process of fabricating a filling portion and a sealing layer of the display device in accordance with Embodiment 1 of the present disclosure.

FIG. 15 is a flow Chart for describing in more detail an exemplary formation of the filling portion 51 and the sealing layer 6 represented by step S5 in FIG. 6. The formation of the filling portion 51 and the sealing layer 6 is described in accordance with the flow chart in FIG. 15 and with reference to the step-specific cross-sectional views shown in FIGS. 16 to 19.

Figure 16:
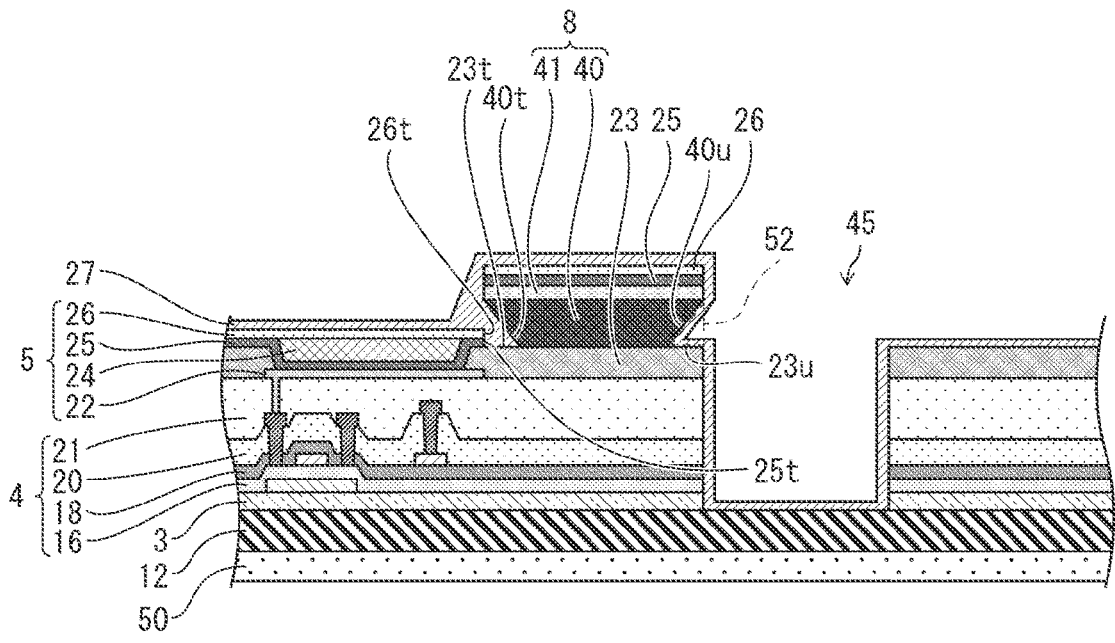
FIG. 16 is a step-specific, sequential cross-sectional view of the process of manufacturing the display device in accordance with Embodiment 1 of the present disclosure.

After the protrusion portion 8 and the light-emitting layer 5 are formed as described above, the first inorganic sealing film 27 is subsequently formed as shown in FIG. 16 (step S5-1). The first inorganic sealing film 27, which is the lowest layer in the sealing layer 6, is formed by CVD (chemical vapor deposition). Therefore, the first inorganic sealing film 27 is formed reaching as far as the reverse-tapered face 40t and the reverse-tapered face 40u of the protrusion portion 8 and the top face 23t and the top face 23u of the organic insulation film 23 that are behind the protrusion portion 8 in a plan view.

Figure 17:
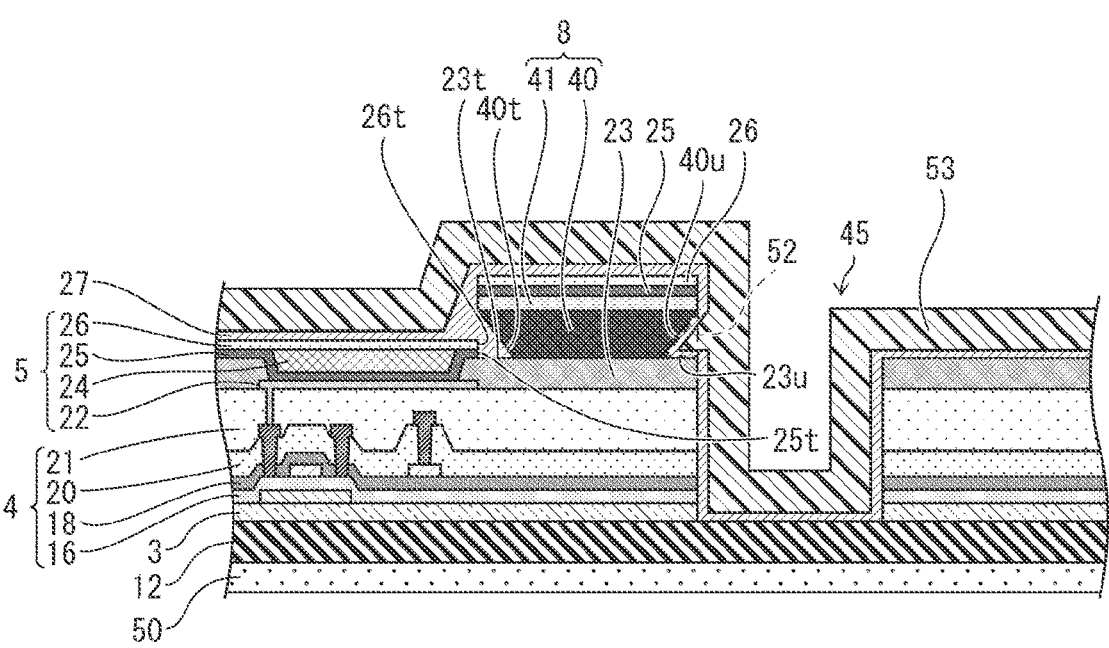
FIG. 17 is another step-specific, sequential cross-sectional view of the process of manufacturing the display device in accordance with Embodiment 1 of the present disclosure.

Next, as shown in FIG. 17, the filling layer which is a precursor to the filling portion 51, is formed (step S5-2, embedding step). The filling layer 53 is formed by vapor deposition polymerization. Therefore, the filling layer 53 is formed reaching as far as a gap between the reverse-tapered face 40u of the protrusion portion 8 and the top face 23u of the organic insulation film 23, the gap being behind the protrusion portion 8 in a plan view. As a result of this, the filling material for the filling layer 53 is embedded in the space 52. Note that in doing so, the filling layer 53 may be formed by any method provided that the space 52 is filled with the filling material.

Figure 18:
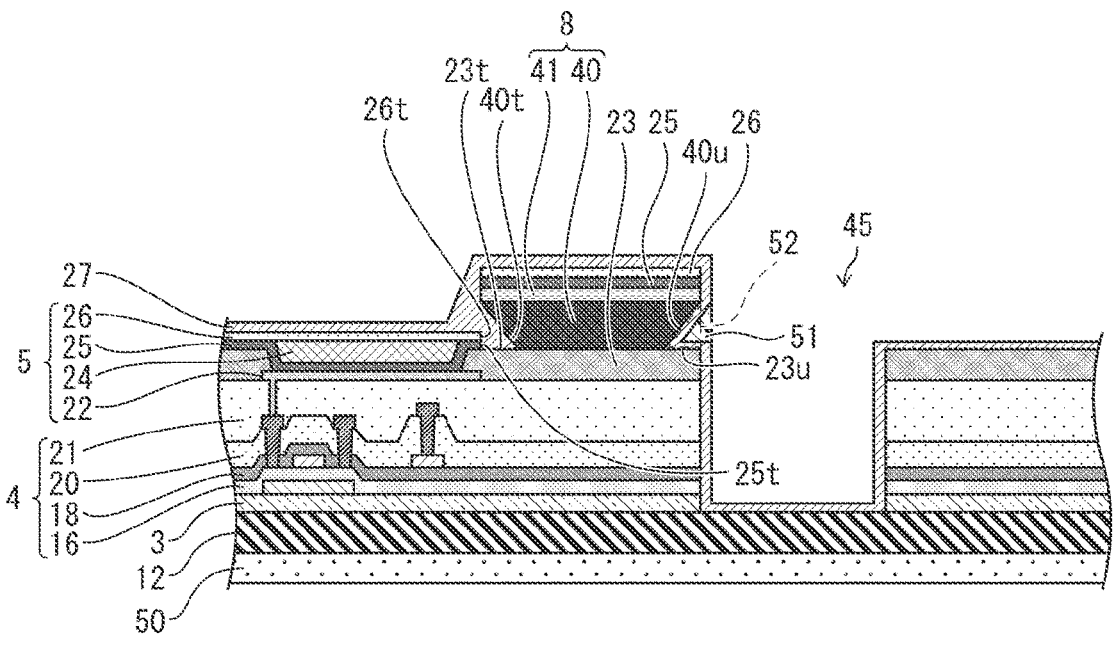
FIG. 18 is still another step-specific, sequential cross-sectional view of the process of manufacturing the display device in accordance with Embodiment 1 of the present disclosure.

Next, as shown in FIG. 18, the filling layer 53 is asked from above (step S5-3, ashing step). Therefore, the filling layer 53 is removed, except, for example, those parts thereof behind the protrusion portion 8. As a result of this, the filling material embedded in the space 52 is left as the filling portion 51. This ashing is preferably performed after the first inorganic sealing film 27 is formed, to prevent damaging the light-emitting layer 5. In addition, the ashing is preferably performed before the organic sealing film 28 is formed or after the second inorganic sealing film 29 is formed, to prevent damaging the organic sealing film 28.

Figure 19:
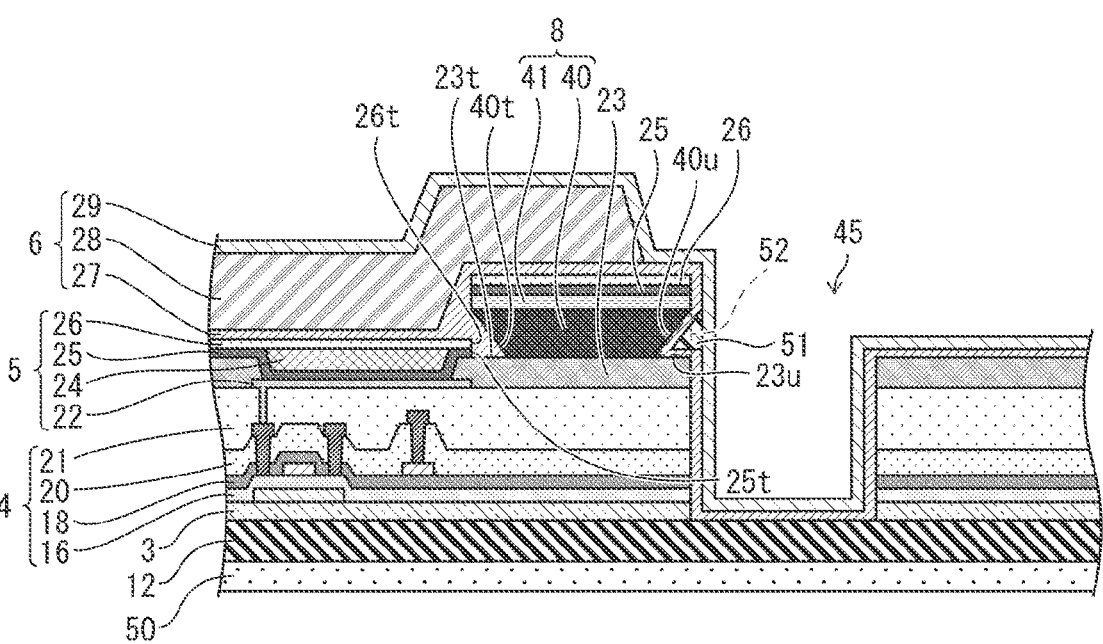
FIG. 19 is yet another step-specific, sequential cross-sectional view of the process of manufacturing the display device in accordance with Embodiment 1 of the present disclosure.

Next, as shown in FIG. 19, the organic sealing film 28 is formed (step S5-4), and the second inorganic sealing film 29 is formed (step S5-5).

After Forming Filling Portion

Figure 20:
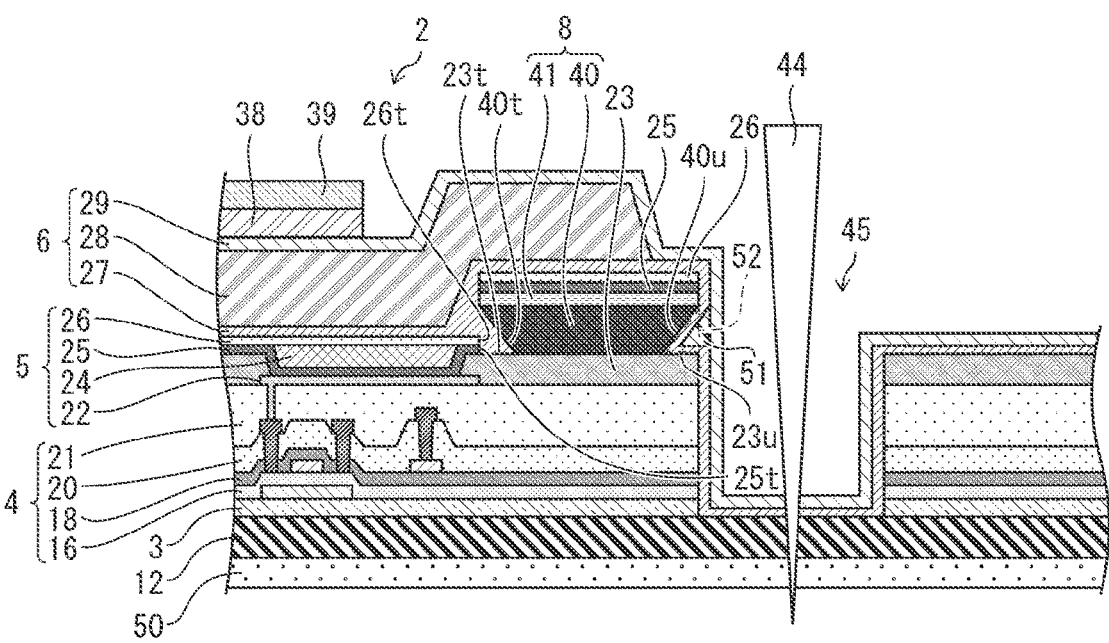
FIG. 20 is a yet still another step-specific, sequential cross-sectional view of the process of manufacturing the display device in accordance with Embodiment 1 of the present disclosure.
Figure 21:
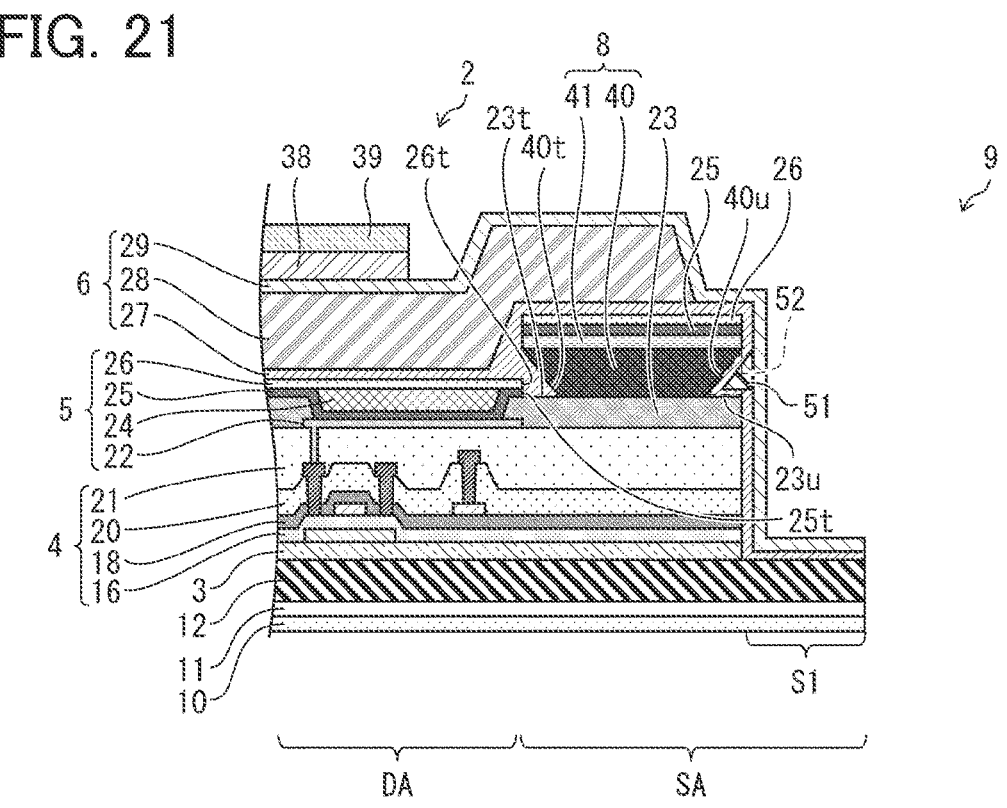
FIG. 21 is a further step-specific, sequential cross-sectional view of the process of manufacturing the display device in accordance with Embodiment 1 of the present disclosure.
Figure 22:
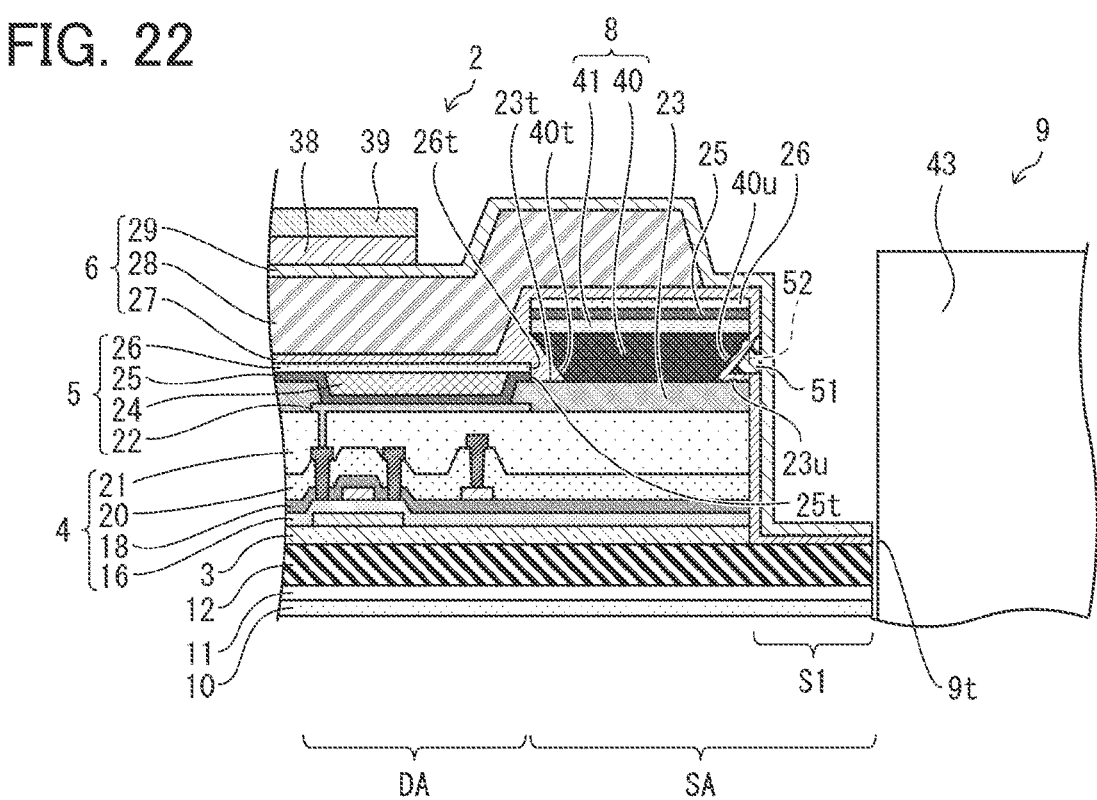
FIG. 22 is still a further step-specific, sequential cross-sectional view of the process of manufacturing the display device in accordance with Embodiment 1 of the present disclosure.

A more detailed description is given next of step S6 to step S11 shown in FIG. 6 with reference to FIGS. 20 to 22.

Next, step S6 to step S9 are performed. In other words, the functional film 39 is attached to the top face of the sealing layer 6 via the adhesion layer 38, the glass substrate 50 is detached from the resin layer 12, and the base member 10 is attached to the bottom face of the resin layer 12 via the adhesion layer 11. Hence, the layered structure shown in FIG. 20 is obtained.

Next, a hole is bored through the resin layer 12, which is an organic layer exposed in the depression portion 45, and through the glass substrate 50, which is a base member, to form the notched portion 9 (step S6, notched portion forming step). The hole may be bored by, for example, a laser 44 from a laser cutter shown in FIG. 20. The laser 44 may be a femtolaser, a YAG laser, or a pulse laser. In addition, the laser 44 preferably does not generate much heat in the stack body when the hole is bored. Furthermore, the output of the laser 44 may be altered during the course of the bole-boring process by the laser 44, to obtain an output suitable for the fabrication of each layer of the stack body.

The notched portion 9 and the slit S1 shown in FIG. 21 are obtained by the hole-boring process. Hence, the non-active area surrounded by the active area DA becomes an area where the notched portion 9 is provided and the frame area SA where the slit S1 and the protrusion portion 8 are provided. Finally, the external module 43 is mounted to the notched portion 9 (step S7) to obtain the structure shown in FIG. 22. Thereafter, the display device 2 shown in FIGS. 1 to 4 is obtained by performing step S8 and subsequent steps.

Variation Example

Figure 23:
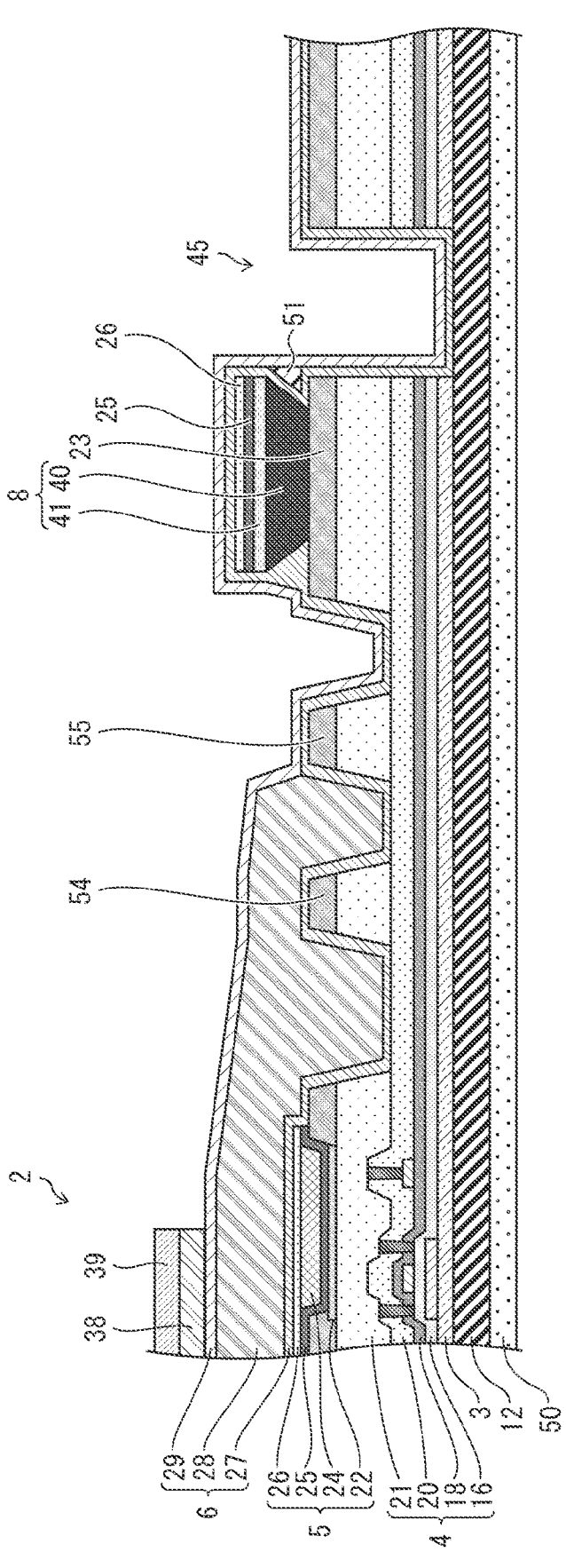
FIG. 23 is a cross-sectional view of the surroundings of a boundary between an active area and an external module of the display device in accordance with a variation example of Embodiment 1 of the present disclosure.

FIG. 23 is a cross-sectional view of the surroundings of an outer periphery of the external module 43 of the display device 2 in accordance with a variation example of the present embodiment.

In the example described above, the end portion on the notched portion 9 side of the organic sealing film 28 is located on the protrusion portion 8. However, the scope of the present embodiment is not limited to this. Alternatively, referring to FIG. 23, the end portion may be located, for example, on the active area DA side of the protrusion portion 8, by providing a first bank 54 and a second bank 55 in the frame area SA in such a manner as to surround the protrusion portion 8.

Embodiment 2

Figure 24:
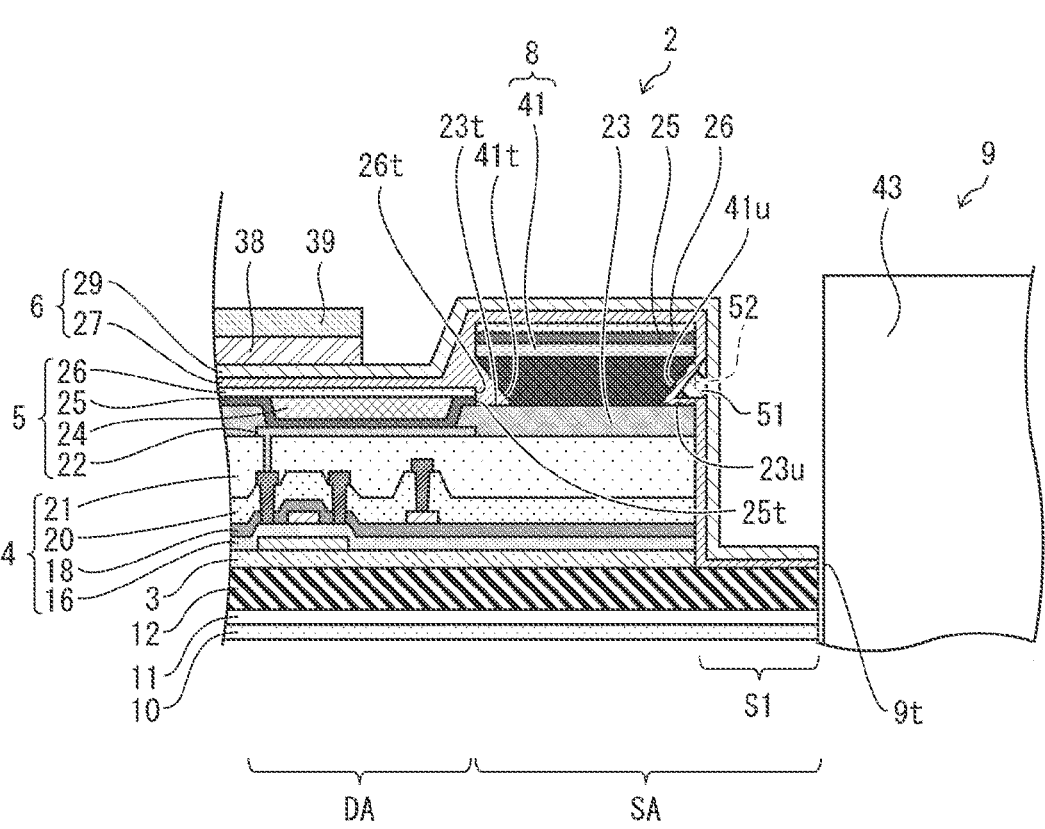
FIG. 24 is a cross-sectional view of the surroundings of a boundary between an active area and an external module of a display device in accordance with Embodiment 2 of the present disclosure.

FIG. 24 is a cross-sectional view of the surroundings of an outer periphery of the external module 43 of the display device 2 in accordance with the present embodiment. The display device 2 in accordance with the present embodiment only differs from Embodiment 1 in that the protrusion portion 8 only includes the photoresist layer 41, that a reverse-tapered face 41*t* is included on one of the side faces of the photoresist layer 41 that is in proximity to the active area DA, and that a reverse-tapered face 41*u* is included on another one of the side faces that is in proximity to the notched portion 9. The reverse-tapered face 41*t* is tilted to a side facing the notched portion 9 from the display screen toward the base member 10. The reverse-tapered face 41*u* is tilted to a side facing the active area DA from the display screen toward the base member 10. As a result of this, the space 52 in which the filling portion 51 is embedded is located between the reverse-tapered face 41*u* of the protrusion portion 8 and the top face of the organic insulation film 23 overlapping the reverse-tapered face 41*u* in a plan view and overlaps the reverse-tapered face 41*u* in a plan view perpendicular to the base member 10 (or the glass substrate 50). Furthermore, in the present embodiment, the photoresist layer 41 includes a negative photosensitive resin. A method of manufacturing the display device 2 shown in FIG. 24 will be described with reference to the step-specific cross-sectional views shown in FIGS. 25 to 26.

Figure 25:
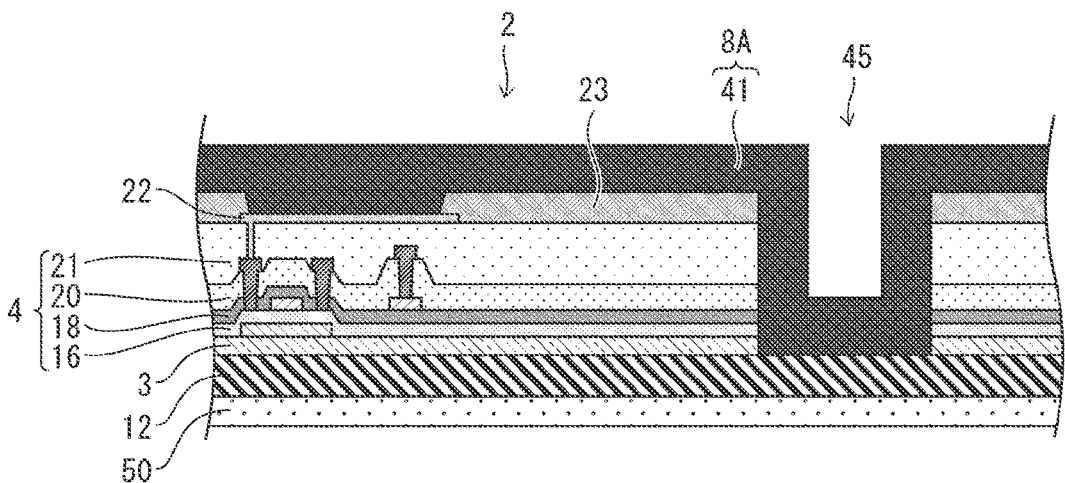
FIG. 25 is a step-specific, sequential cross-sectional view of a process of manufacturing of the display device in accordance with Embodiment 2 of the present disclosure.

First, similarly to the preceding embodiment, the process up to the step of forming and patterning the organic insulation film 23 is completed. Next, as shown in FIG. 25, the photoresist layer 41 is applied to an upper layer of the organic insulation film 23 and the first electrode 22 and to the inner face of the depression portion 45. In this state, the photoresist layer 41 is exposed to light through a mask in which holes are only formed in locations where the protrusion portions 8 will be eventually provided and is washed in a developing solution to develop the photoresist layer 41.

Figure 26:
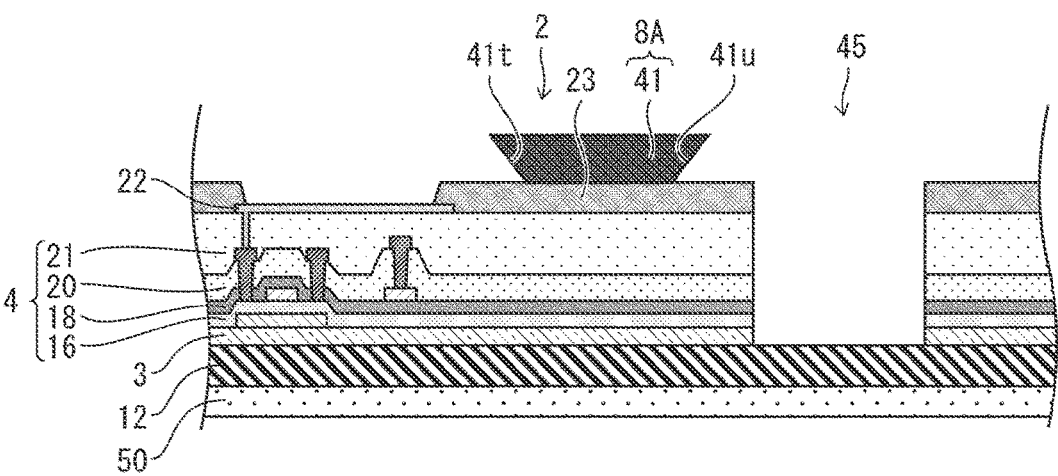
FIG. 26 is another step-specific, sequential cross-sectional view of the process of manufacturing the display device in accordance with Embodiment 2 of the present disclosure.

In doing so, if the photoresist layer 41 is exposed to light from above the mask, the lower parts are exposed to a decreasing amount of light. Therefore, since the photoresist layer 41 includes a negative photosensitive resin, the reverse-tapered face 4 it and the reverse-tapered face 41*u* shown in FIG. 26 are formed on the photoresist layer 41 near the end portions of the mask after the development.

From this state, similarly to the aforementioned embodiment, the step of forming the EL light-emitting layer 24 and subsequent steps are performed to obtain the display device 2 shown in FIG. 24.

The filling portion 51 in accordance with present Embodiment 2 preferably meets conditions similar to the conditions met by the filling portion 51 in accordance with aforementioned Embodiment 1. In addition, in the present embodiment, the refractive index of the filling material constituting the filling portion 51 preferably differs from the refractive index of the protrusion portion 8 (in other words, the photoresist layer 41) by less than 0.5. In this case, light is barely reflected at the interface between the protrusion portion 8 and the filling portion 51. Therefore, scattering of light by the space 52 can be further reduced.

Figure 27:
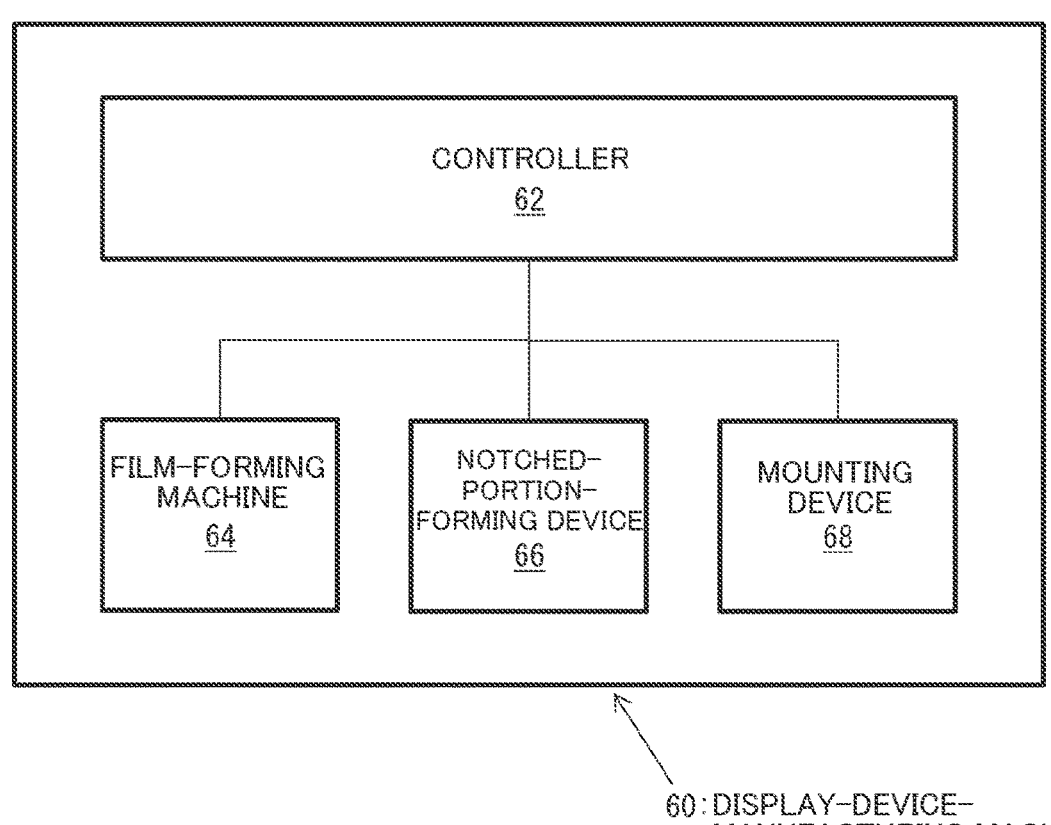
FIG. 27 is a block diagram of a display-device-manufacturing machine in accordance with any embodiment of the present disclosure.

FIG. 27 is a block diagram of a display-device-manufacturing machine 60 used in the process of manufacturing the display device 2 in accordance with any one of the above-described embodiments. The display-device-manufacturing machine 60 includes a controller 62, a film-forming machine 64, a notched-portion-forming device 66, and a mounting device 68. The controller 62 controls the operation of the film-forming machine 64, the notched-portion-forming device 66, and the mounting device 68. The film-forming machine 64 may form each layer of the display device 2, including the light-emitting layer 5 and the filling layer 53. The notched-portion-forming device 66 may form the notched portion 9. The mounting device 68 may mount external module 43 to the notched portion 9.

General Description

A display device of aspect 1 includes: a base member; a thin film transistor formed on the base member; an organic insulation film formed on the thin film transistor; a light-emitting layer formed on the organic insulation film; and a sealing layer formed on the light-emitting layer, the display device having: an active area that contributes to display; and a non-active area surrounded by the active area, the non-active area including: a notched portion; and a protrusion portion surrounding the notched portion and having, on a notched portion side, a side face including a reverse-tapered face, the light-emitting layer being disconnected as a result of a step at the protrusion portion, a filling material being embedded in at least a part of a space located between the reverse-tapered face and a top face of the organic insulation film, the top face overlapping the reverse-tapered face in a plan view.

The display device of aspect 2 may, in foregoing aspect 1, be configured such that in a cross-section perpendicular to the reverse-tapered face and the top face of the organic insulation film, a ratio of a cross-sectional area of the filling material to a cross-sectional area of the space is greater than or equal to 50%.

The display device of aspect 3 may, in foregoing aspect 1 or 2, be configured such that the filling material has a refractive index of from 1.5 to 2.0, both inclusive.

The display device of aspect 4 may, in any one of foregoing aspects 1 to 3, be configured such that the filling material and the protrusion portion differ in refractive index by less than 0.5.

The display device of aspect 5 may, in any one of foregoing aspects 1 to 4, be configured such that the filling material and the organic insulation film differ in refractive index by less than 0.5.

The display device of aspect 6 may, in any one of foregoing aspects 1 to 5, be configured such that the sealing layer includes a first inorganic sealing film, an organic sealing film, and a second inorganic sealing film, all of which are provided in a stated order from a side of the light-emitting layer, and the filling material and the first inorganic sealing film differ in refractive index by less than 0.5.

The display device of aspect 7 may, in any one of foregoing aspects 1 to 6, be configured such that the sealing layer includes a first inorganic sealing film, an organic sealing film, and a second inorganic sealing film, all of which are provided in a stated order from a side of the light-emitting layer, and the filling material and the second inorganic sealing film differ in refractive index by less than 0.5.

The display device of aspect 8 may, in any one of foregoing aspects 1 to 7, be configured such that the filling material has an optical concentration of 0.1 or greater.

The display device of aspect 9 may, in any one of foregoing aspects 1 to 8, be configured such that the filling material is a resin material.

A display device of aspect 10 may, in foregoing aspect 9, be configured such that the resin material contains at least one of groups including polyurea, siloxane polymer, and acrylic.

The display device of aspect 11 may, in any one of foregoing aspects 1 to 10, be configured such that the sealing layer includes a first inorganic sealing film, an organic sealing film, and a second inorganic sealing film, all of which are provided in a stated order from a side of the light-emitting layer, and the first inorganic sealing film covers the reverse-tapered face.

The display device of aspect 12 may, in any one of foregoing aspects 1 to 12, be configured such that the sealing layer includes a first inorganic sealing film, an organic sealing film, and a second inorganic sealing film, all of which are provided in a stated order from a side of the light-emitting layer, and the second inorganic sealing film covers the filling material.

The display device of aspect 13 may, in any one of foregoing aspects 1 to 12, be configured such that an external module is provided in the notched portion.

A method of manufacturing a display device of aspect 14 is a method of manufacturing a display device including: a base member; a thin film transistor formed on the base member; an organic insulation film formed on the thin film transistor; a light-emitting layer formed on the organic insulation film; and a sealing layer formed on the light-emitting layer, the method including: the protrusion portion forming step of forming a protrusion portion in a lower layer of the light-emitting layer in a non-active area surrounded by an active area that contributes to display; the light-emitting layer forming step of forming the light-emitting layer on the organic insulation film and on the protrusion portion and disconnecting the light-emitting layer as a result of a step at the protrusion portion; and the notched portion forming step of forming a notched portion in a location surrounded by the protrusion portion, wherein in the protrusion portion forming step, the protrusion portion is formed so as to have, on a notched portion side of the protrusion portion, a side face including a reverse-tapered face, and the method further includes the embedding step of embedding a filling material in at least a part of a space located between the reverse-tapered face and a top face of the organic insulation film, the top face overlapping the reverse-tapered face in a plan view.

The method of manufacturing a display device of aspect 15 may, in foregoing aspect 14, be configured so as to further include the ashing step of ashing a part of the filling material from above the protrusion portion.

The present disclosure is not limited to the description of the embodiments above and may be altered within the scope of the claims. Embodiments based on a proper combination of technical means disclosed in different embodiments are encompassed in the technical scope of the present disclosure. Furthermore, new technological features can be created by combining different technical means disclosed in the embodiments.

The invention claimed is:

1. A display device comprising:
a base member;
a thin film transistor layer formed on the base member, the thin film transistor layer having a thin film transistor and an organic insulation film formed on the thin film transistor;
a light-emitting layer formed on the thin film transistor layer, the light-emitting layer including a first electrode, a second electrode, an electroluminescence light-emitting layer positioned between the first electrode and the second electrode, and an organic film covering an edge of the first electrode; and
a sealing layer formed on the light-emitting layer,
the display device having:
an active area that contributes to display in a plan view;
a non-active area surrounded by the active area in the plan view; and
a notched portion formed in the non-active area in the plan view, the notched portion being a portion where the base member, the thin film transistor layer, the light-emitting layer, and the sealing layer are removed,
the non-active area including:
a protrusion portion formed between the active area and the notched portion, the protrusion portion surrounding the notched portion and having, on a notched portion side, a side face including a reverse-tapered face, the protrusion portion further being formed on the thin film transistor layer,
wherein:
the organic film is formed between the protrusion portion and the thin film transistor layer,
the organic film directly contacts the protrusion portion,
a filling material is embedded in at least a part of a space located between the reverse-tapered face and a top face of the organic film,
the top face overlaps the reverse-tapered face in the plan view,
the sealing layer includes a first inorganic sealing film, an organic sealing film, and a second inorganic sealing film, all of which are provided in this stated order from a side of the light-emitting layer,
the first inorganic sealing film covers the reverse-tapered face,
the second inorganic sealing film covers the filling material,
the filling material has a refractive index from 1.5 to 2.0, both inclusive, and
the filling material is formed of a material different from a material forming the organic sealing film and a material forming the organic film.

2. The display device according to claim 1, wherein, in a cross-section perpendicular to the reverse-tapered face and the top face of the organic film, a ratio of a cross-sectional area of the filling material to a cross-sectional area of the space is greater than or equal to 50%.

3. The display device according to claim 1, wherein the filling material and the protrusion portion differ in refractive index by less than 0.5.

4. The display device according to claim 1, wherein the filling material and the organic film differ in refractive index by less than 0.5.

5. The display device according to claim 1, wherein the filling material and the first inorganic sealing film differ in refractive index by less than 0.5.

6. The display device according to claim 1, wherein the filling material and the second inorganic sealing film differ in refractive index by less than 0.5.

7. The display device according to claim 1, wherein the filling material has an optical concentration of 0.1 or greater.

8. The display device according to claim 1, wherein the filling material is a resin material.

9. The display device according to claim 8, wherein the resin material contains at least one of groups including polyurea, siloxane polymer, and acrylic.

10. The display device according to claim 1, wherein an external module is provided in the notched portion.

11. The display device according to claim 1, wherein a slit is formed between the notched portion and the protrusion portion, the slit surrounding the notched portion, and the slit is a portion where the thin film transistor layer, the light-emitting layer, and the sealing layer are removed.

12. The display device according to claim 1, wherein the protrusion portion comprises a metal layer and a resist layer formed on the metal layer.

13. The display device according to claim 1, wherein a metal layer is formed on the protrusion portion, and the metal layer is made of the same material as the second electrode.

14. The display device according to claim 1, wherein the protrusion portion has a second side face in proximity to the active area, the second side face including a reverse-tapered face.

15. The display device according to claim 1, wherein a bank is formed in the non-active area, the bank surrounding the protrusion portion.

\* \* \* \* \*